US011152918B1

(12) United States Patent
Koplow

(10) Patent No.: US 11,152,918 B1
(45) Date of Patent: Oct. 19, 2021

(54) LOW MODULATION INDEX 3-PHASE SOLID STATE TRANSFORMER

(71) Applicant: National Technology & Engineering Solutions of Sandia, LLC, Albuquerque, NM (US)

(72) Inventor: Jeffrey P. Koplow, San Ramon, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/071,009

(22) Filed: Oct. 15, 2020

Related U.S. Application Data

(60) Provisional application No. 62/915,819, filed on Oct. 16, 2019.

(51) Int. Cl.
| | |
|---|---|
| *H03K 3/012* | (2006.01) |
| *H03K 17/687* | (2006.01) |
| *H01F 27/42* | (2006.01) |
| *H01F 27/28* | (2006.01) |

(52) U.S. Cl.
CPC ............. *H03K 3/012* (2013.01); *H01F 27/28* (2013.01); *H01F 27/42* (2013.01); *H03K 17/687* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,517,300 | A * | 6/1970 | McMurray | H02M 5/225 363/25 |
| 5,947,093 | A * | 9/1999 | Ward | F02P 3/08 123/598 |
| 6,891,303 | B2 * | 5/2005 | Leijon | H01F 27/323 310/196 |
| 9,065,321 | B2 * | 6/2015 | Divan | H02M 7/4807 |
| 9,444,275 | B2 * | 9/2016 | Huang | H02J 7/0068 |

(Continued)

OTHER PUBLICATIONS

Anurag, et al., "Design of a Medium Voltage Mobile Utilities Support Equipment based Solid State Transformer (MUSE-SST) with 10 kV SiC MOSFETs for Grid Interconnection", In 2018 IEEE, pp. 1-8.

*Primary Examiner* — Adam D Houston
(74) *Attorney, Agent, or Firm* — Medley, Behrens & Lewis, LLC

(57) ABSTRACT

A solid-state transformer (SST) comprises a transformer core, a primary winding, a secondary winding, a primary-side switch bank, and a secondary-side switch bank. Each of the switch banks includes six 4-quadrant switches. The twelve 4-quadrant switches are toggled on and off over six clock cycles in a repetitive sequence with a period that is a function of a desired operating frequency of the transformer. The sequence is configured such that at any given time, 2 of 3 input and output phases are connected to the primary and secondary windings. The SST further includes L-C filter circuits that are configured to filter high-frequency components of current and voltage waveforms such that these components are not back-fed to the electrical mains or delivered to a load. The SST includes a primary-side filter circuit and a secondary-side filter circuit that can each include respective L-C filters for three input or output phases.

20 Claims, 19 Drawing Sheets

(56) References Cited

U.S. PATENT DOCUMENTS

| Patent/Pub No. | Date | Name | Classification |
|---|---|---|---|
| 10,063,158 B1* | 8/2018 | Li | H02M 3/33584 |
| 10,069,430 B2* | 9/2018 | Sahoo | H02M 7/483 |
| 10,688,880 B2* | 6/2020 | Kim | H02M 7/5387 |
| 11,021,069 B1* | 6/2021 | Elshaer | H02M 3/33584 |
| 2004/0227560 A1* | 11/2004 | de Buda | H03K 17/6874 327/427 |
| 2005/0111246 A1* | 5/2005 | Lai | H02M 7/483 363/157 |
| 2007/0127182 A1* | 6/2007 | Chang | H03K 17/0822 361/100 |
| 2009/0225569 A1* | 9/2009 | Begalke | H02M 3/3378 363/17 |
| 2012/0120697 A1* | 5/2012 | Cuk | H02M 1/4216 363/126 |
| 2012/0319483 A1* | 12/2012 | Scruggs | H02J 1/10 307/52 |
| 2013/0051102 A1* | 2/2013 | Huang | H02M 7/217 363/127 |
| 2013/0201733 A1* | 8/2013 | Divan | H02M 5/225 363/39 |
| 2014/0009189 A1* | 1/2014 | Mauder | H01L 29/7786 327/109 |
| 2015/0229227 A1* | 8/2015 | Aeloiza | H02M 5/04 323/355 |
| 2015/0280595 A1* | 10/2015 | White | H02M 5/297 318/778 |
| 2015/0365003 A1* | 12/2015 | Sadwick | H02M 3/28 363/21.01 |
| 2016/0241137 A1* | 8/2016 | Sun | H02J 4/00 |
| 2017/0099008 A1* | 4/2017 | Keister | H02M 5/458 |
| 2017/0331387 A1* | 11/2017 | Gougerchian | H02M 5/257 |
| 2017/0346414 A1* | 11/2017 | Mondal | H05B 41/2824 |
| 2018/0198377 A1* | 7/2018 | Keister | H02M 1/42 |
| 2018/0358814 A1* | 12/2018 | Rates Palau | H02J 9/04 |
| 2019/0280586 A1* | 9/2019 | Chen | H02J 3/18 |
| 2019/0296634 A1* | 9/2019 | Ikeda | H03K 17/168 |
| 2019/0312521 A1* | 10/2019 | Cao | H02M 5/4585 |
| 2019/0326280 A1* | 10/2019 | Imam | H03K 17/6874 |
| 2020/0059190 A1* | 2/2020 | Kim | B60L 15/20 |
| 2021/0013743 A1* | 1/2021 | Hu | H02J 50/12 |
| 2021/0044233 A1* | 2/2021 | Glose | H02P 27/12 |
| 2021/0091767 A1* | 3/2021 | Cairoli | H03K 17/102 |
| 2021/0135588 A1* | 5/2021 | Prasad | G01R 1/0491 |

* cited by examiner

LOW MODULATION INDEX 3-PHASE SOLID STATE TRANSFORMER

RELATED APPLICATION

This application claims priority to U.S. Provisional Patent Application No. 62/915,819, filed on Oct. 16, 2019 and entitled "LOW MODULATION INDEX 3-PHASE SOLID STATE TRANSFORMER", the entirety of which is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

On several important performance metrics, conventional 50/60 Hz steel-core and copper-or-aluminum winding transformer technology sets an extremely high bar. The efficiency of a conventional power transformer is 98-99%, and conventional transformer technology is naturally capable of handling very high voltage levels.

Various approaches have been proposed to develop a solid-state transformer (SST) for high-power, workhorse applications such as those found throughout the electrical grid. The high-speed, low-loss, high-voltage, high-current semiconductor switches required to implement many SST designs tend to be expensive, and relatively limited in voltage capability, however. Moreover, ohmic and other losses in such semiconductor switches impose limits on SST efficiency, power handling capability, and scalability. Yet another difficulty in the implementation of SSTs is the high potential for generation of electromagnetic interference (EMI), such as that which plagued early switching power supply circuit designs (despite operating at relatively low power). Furthermore, any proposed solution to simultaneously address all of the above challenges must also meet extremely stringent cost and long-term reliability requirements in order to be economically feasible and competitive.

An SST architecture proposed by McMurray and disclosed in U.S. Pat. No. 3,517,300 has various drawbacks. The McMurray architecture uses 4-quadrant switches and requires 8 MOSFETs and one transformer per phase. Thus, for a 3-phase SST, 24 MOSFETs and three transformers are required. Furthermore, because McMurray uses a center-tapped transformer, each half winding needs enough turns (magnetizing inductance) to hold off full line voltage to prevent saturation of the transformer core. Increasing the number of turns increases the magnetizing inductance, which increases the leakage inductance proportionally. Leakage inductance is undesirable because it inserts an unwanted voltage drop. The greater number of turns forces the cross-sectional area of the wires used in the winding to be reduced to maintain a same size of the SST, which increases ohmic loss. Moreover, an additional factor of 2 in ohmic loss is incurred because the available space for copper/aluminum windings must accommodate two half windings, instead of a single full winding. Yet another difficulty of the McMurray architecture is the large amount of EMI generated by the inductive kick that occurs during switch opening. Even if MOSFETs in the McMurray architecture are toggled on/off at high frequency, the resulting EMI waveform presents challenges from the standpoint of passive component size and cost. Simulations indicate that efficiency of the McMurray SST peaks a little above 98%, but it does so at relatively low output power compared to embodiments described herein employing the same number of identical MOSFET switches. Replacing each half-H-bridge in the McMurray architecture with a full H-bridge alleviates some problems, but requires 48 MOSFETs to create a 3-phase transformer instead of 24, resulting in increased cost and reduced efficiency. Other modifications to the McMurray architecture employ resonant elements that alleviate leakage inductance problems, but still require three distinct transformers to achieve three-phase operation. Still further, these architectures exhibit nearly 100% amplitude modulation index in the magnetic flux density of the transformer core, which is undesirable from the standpoint of transformer core loss.

Another proposed 3-phase SST architecture referred to as "Dyna-C" (U.S. Pat. No. 9,065,321) has a low parts count, employing only 12 insulated-gate bipolar transistors (IGBTs) and 12 diodes. But it does not permit bi-directional operation (i.e., current flow in either direction through the IGBTs) and has significantly lower efficiency than conventional transformer technology (89% experimental, 96% theoretical).

SUMMARY

The following is a brief summary of subject matter that is described in greater detail herein. This summary is not intended to be limiting as to the scope of the claims.

Various technologies pertaining to an AC-AC SST transformer are described herein. Technologies described herein are intended to provide an improved SST circuit architecture that can meet and exceed the performance of conventional transformer technology, at a lower cost than conventional transformer technology, and with comparable or better reliability. It is anticipated that modernization of the electrical grid will benefit significantly from the added value of advanced transformer features immediately enabled by transitioning to solid state technology, such as continuously adjustable closed-loop voltage regulation.

In an exemplary embodiment, an SST comprises a transformer core, a primary winding, a secondary winding, a primary-side switch bank, and a secondary-side switch bank. Each of the switch banks includes six four-quadrant switches. The twelve 4-quadrant switches are toggled on and off in a predetermined pattern over six clock cycles in a repetitive sequence with a period that is a function of a desired operating frequency of the transformer. For example, excitation of the high-frequency transformer with a waveform whose fundamental frequency is 100 kHz corresponds to a period of 10 microseconds for the repetitive switching sequence. It will be understood from the present disclosure that the operating frequency of the SST (i.e., a frequency of a current or voltage waveform seen at the primary and secondary windings) can be substantially greater than a frequency (e.g. 50/60 Hz) of an input to the SST or an output of the SST to a load. The switch toggling sequence is configured such that at any given time, 2 of 3 input and output phases are connected to the primary and secondary windings, respectively, and one phase is left floating.

The SST can further include filter circuits that are configured to filter high-frequency components of current and voltage waveforms such that these components are not back-fed to the electrical mains or delivered to a load. The SST can include a primary-side filter circuit and a secondary-side filter circuit. Each of the primary-side and the secondary-side filter circuits can include respective L-C filters for each of three input or output phases. The filter circuits are configured such that, despite the SST switching at a frequency greater than a line frequency of the input mains or the output load, EMI is not substantially conducted from the SST to the input mains or to the output load.

As will be apparent to those of skill in the art from the present disclosure, an SST described herein has several advantages over prior art devices. SSTs described herein can be used to transform three AC phases using only twelve 4-quadrant switches and a single transformer core. Furthermore, an SST described herein can have a small modulation index of magnetic flux density in its core, thereby reducing the size, cost, and loss of the transformer core relative to designs with higher modulation index of the magnetic flux density, such as the McMurray architecture discussed earlier. SSTs described herein further exhibit high frequency EMI (e.g., having a fundamental frequency twice a switching frequency of the SST), which can obviate the need for electrolytic capacitors and can reduce the size, cost, and loss associated with inductors relative to transformer designs with lower frequency EMI. SSTs described herein may further be suitable to meet and potentially surpass the efficiency of existing conventional transformers. SSTs described herein are also suited to accommodate both delta and Y-connected loads, and are able to be connected in series to increase an effective voltage of a multiple-SST system, in similar fashion to conventional transformers.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
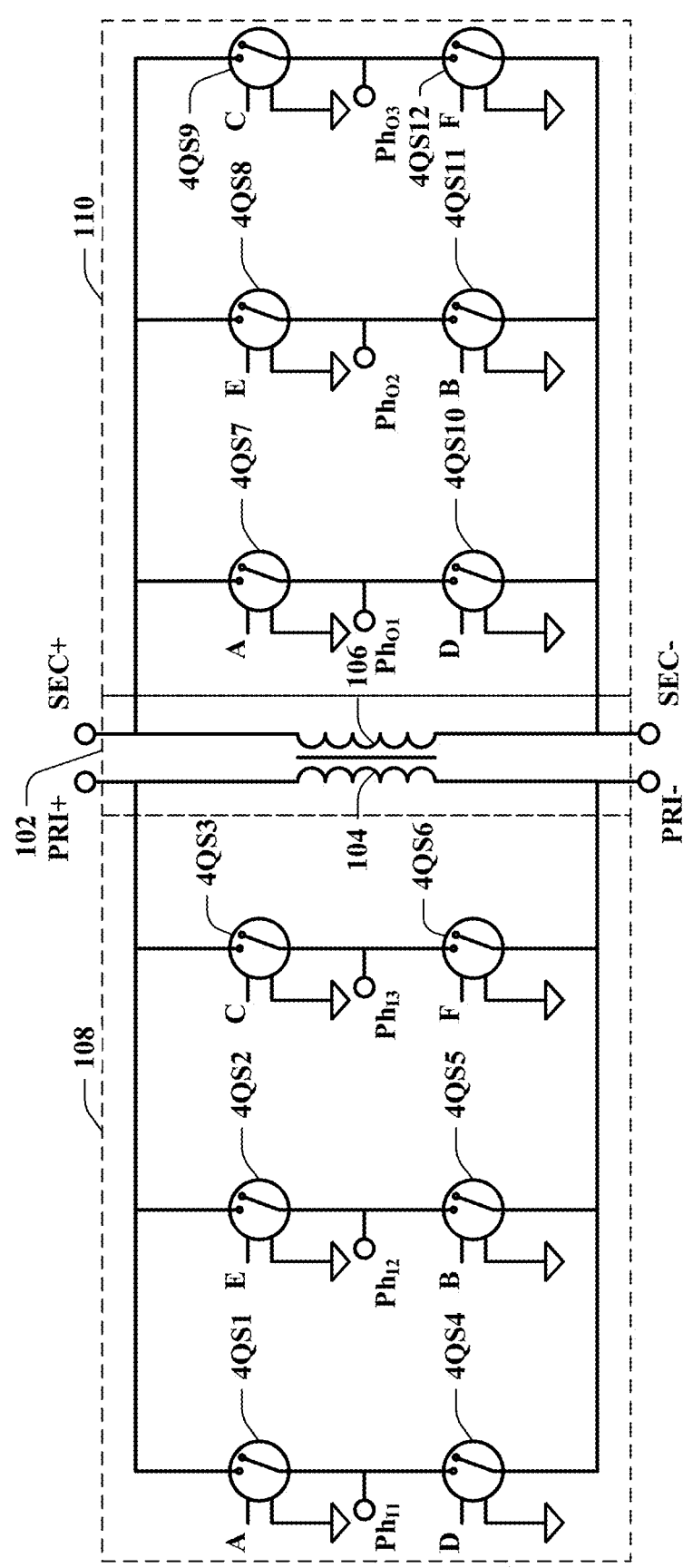
FIG. 1 is a schematic diagram of an exemplary SST.

Various technologies pertaining to a low-modulation index, three-phase (LMI3) SST are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

With reference to FIG. 1, an exemplary LMI3 SST 100 is illustrated. The SST 100 comprises a transformer core 102 that has a primary winding 104 and a secondary winding 106. In exemplary embodiments discussed below with respect to various simulation results, the primary winding 104 and the secondary winding 106 have a same number of turns. However, it is to be understood that the primary winding 104 and the secondary winding 106 can have substantially any desired turns ratio according to a desired step-up or step-down of the SST 100. The SST 100 further comprises a primary-side bank 108 of four-quadrant switches 4QS1-4QS6 and a secondary-side bank 110 of four-quadrant switches 4QS7-4QS12. The primary-side switch bank 108 comprises input terminals $Ph_{I1}$, $Ph_{I2}$, and $Ph_{I3}$ that are respectively connected to a single phase of a three-phase input to the SST 100. By way of example, each of the input terminals $Ph_{I1}$, $Ph_{I2}$, and $Ph_{I3}$ can be connected to a respective phase of a three-phase electrical service (e.g., received from a transmission line, substation, other transformer, etc.). The secondary-side switch bank 110 comprises output terminals $Ph_{O1}$, $Ph_{O2}$, and $Ph_{O3}$ that are respectively connected to a single phase of a three-phase output of the SST 100. By way of example, the output terminals $Ph_{O1}$, $Ph_{O2}$, and $Ph_{O3}$ can be connected to a three-phase load.

As will be described in greater detail below, the input terminals $Ph_{I1}$, $Ph_{I2}$, and $Ph_{I3}$ and the output terminals $Ph_{O1}$, $Ph_{O2}$, and $Ph_{O3}$ of the SST can be connected to respective primary-side and secondary-side filter banks that can be configured to filter EMI developed in the SST 100 such that negligible levels of EMI are passed to a load or electrical mains service lines that are connected to the SST 100. The filter banks can further be configured such that the SST 100 is adapted to receive input voltages having a nominal frequency (e.g., standard 50 Hz or 60 Hz electrical service) at its input terminals $Ph_{I1}$, $Ph_{I2}$, and $Ph_{I3}$ and to output, by way of output terminals of the filter banks, voltages having the same nominal frequency.

Figure 2:
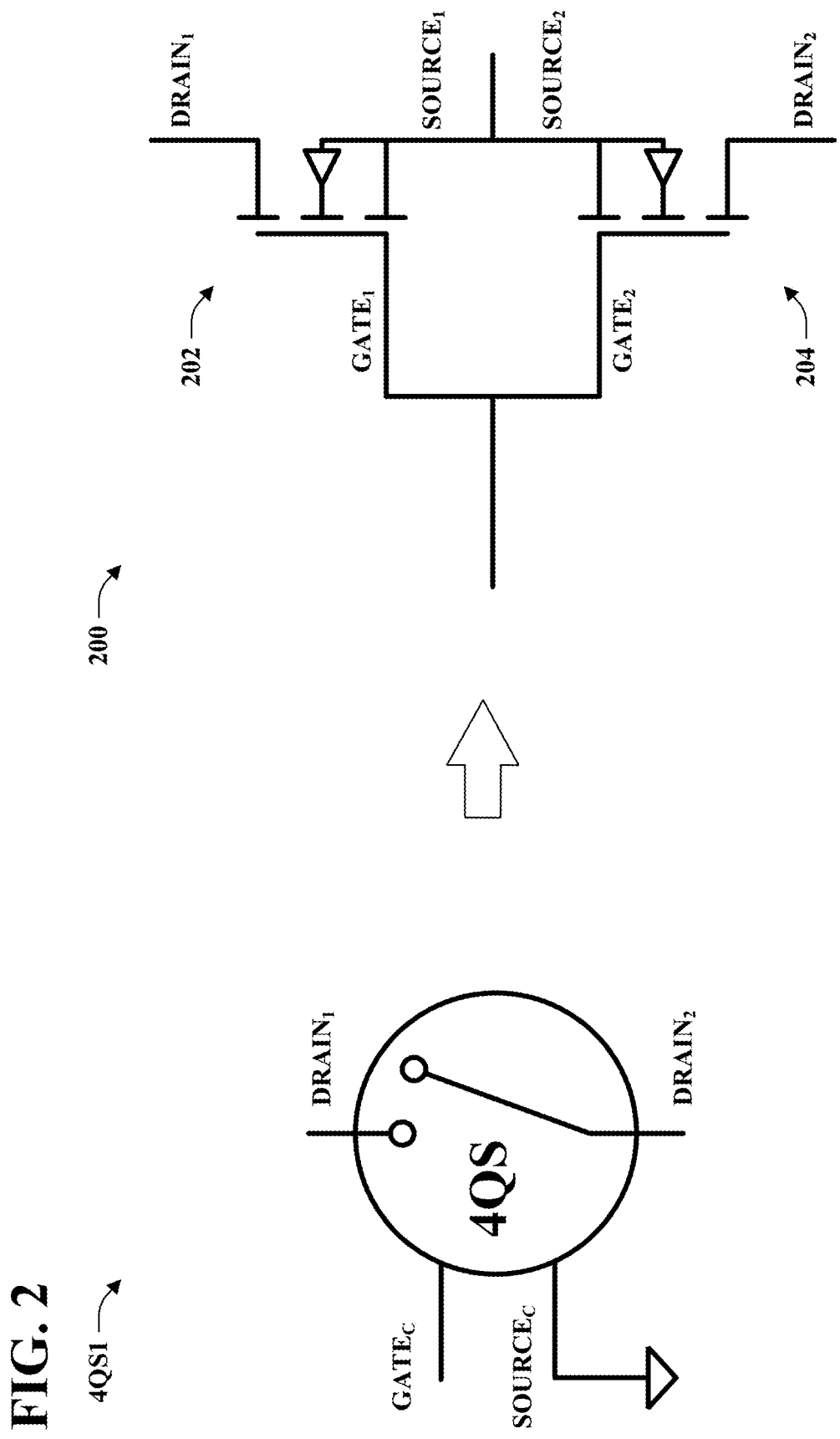
FIG. 2 is a schematic diagram of an exemplary 4-quadrant switch.

The switches 4QS1-4QS12 are 4-quadrant switches. In other words, the switches 4QS1-4QS12 are adapted to operate under positive or negative voltage bias and to conduct positive or negative current. In exemplary embodiments, each of the switches 4QS1-4QS12 can comprise two MOSFETs connected in a common-gate, common-source configuration. By way of example, and referring now to FIG. 2, an equivalent circuit 200 of the switch 4QS1 is shown, wherein the equivalent circuit 200 comprises two n-channel MOSFETs 202, 204 connected in a common-gate, common-source configuration. Each of the MOSFETs 202, 204 comprises respective gate, source, and drain terminals, wherein the gate and source terminals of the MOSFET 202 are connected to the gate and source terminals of the MOSFET 204. Accordingly, the switch 4QS1 has four terminals: two control terminals $GATE_C$ and $SOURCE_C$ that correspond to the common gate and common source of the MOSFETs 202, 204, respectively, and two conducting terminals $DRAIN_1$ and $DRAIN_2$, corresponding to the drain of the first MOSFET 202 and the drain of the second MOSFET 204, respectively. A voltage applied between the common gate and common source terminals of the switch 4QS1 controls an on/off state of the switch 4QS1. Stated differently, the voltage between the common gate and common source terminals controls whether the switch is in a conducting or non-conducting state between the terminals $DRAIN_1$ and $DRAIN_2$.

It is to be understood that other types of switches may be used for the switches 4QS1-4QS12 (e.g. IGBTs instead of MOSFETs), provided they are adapted to 4-quadrant operation. Further, a common-drain configuration of back-to-back MOSFETs could be used instead of a common-source MOSFET pair configuration. This would require that separate gate driver waveforms be supplied to the two gates of the MOSFET pair, because it is the gate-to-source voltage VGS that governs the drain-to-source resistance RDS. However, a common-drain configuration can potentially allow more advanced MOSFET designs that seek to integrate the two back-to-back MOSFETs onto the same semiconductor die to be used, for the purpose of minimizing parasitic inductance, and reducing the number of high-current interconnects.

Referring once again to FIG. 1, exemplary operations of the SST 100 are described. In the exemplary operations described below, device operation is synchronized to a 600 kHz system clock. However, it is to be understood that a wide range of clock frequencies may be used depending on design criteria, application requirements, component selection and future progress in component technology. The twelve 4-quadrant switches 4QS1-4QS12 are toggled on and off in a predetermined pattern over six clock cycles in a repetitive 10-µs-long sequence. The switches 4QS1-4QS12 are controlled by way of logic-level waveforms that are used to trigger electrically isolated MOSFET drivers (not shown) connected to each 4-quadrant switch. By way of example, MOSFET driver circuits can be connected to the 4-quadrant switches 4QS1-4QS12 at their gate terminals (i.e., the common gate shared by the transistors making up each switch). A voltage signal output by a MOSFET driver to the common gate of a switch in the switches 4QS1-4QS12 (e.g., in response to the MOSFET driver receiving a logic high or logic low input) controls whether the switch is open or closed. The MOSFET driver circuits can be connected in a pattern such that a single logic control signal can control one switch in each of the primary-side switch bank 108 and the secondary-side switch bank 110. For example, switches 4QS1 and 4QS7 can be closed by a same logic signal A, switches 4QS5 and 4QS11 can be closed by a same logic signal B, switches 4QS3 and 4QS9 can be closed by a same logic signal C, switches 4QS4 and 4QS10 can be closed by a same logic signal D, switches 4QS2 and 4QS8 can be closed by a same logic signal E, and switches 4QS6 and 4QS12 can be closed by a same logic signal F. These relationships are indicated in the labels A-F at the gate terminals of the switches 4QS1-4QS12 in FIG. 1.

The switches 4QS1-4QS12 can be controlled by dual-channel isolated MOSFET drivers. In exemplary embodiments, each dual-channel isolated MOSFET driver is used to drive a pair of four quadrant switches that correspond to a specific AC phase. For example, one dual-channel driver can be assigned to switches 4QS1 and 4QS4 on the left-hand side of FIG. 1, which are associated with a first AC phase of the mains (at terminal $Ph_{I1}$). The MOSFET drivers are configured to toggle the MOSFET gate-source voltage between two predetermined voltage levels adapted to provide very high-speed switching and very low on-state drain-source resistance (e.g. +20V and −5V). These two voltage levels may be furnished by a miniature isolated DC-DC converter that is voltage referenced to the common source of its respective 4-quadrant switch. Alternatively, a boot-strapping circuit comprising a small number of discrete components may be used instead of a power supply module. The total power consumption of the MOSFET driver ICs and their companion power supply modules is negligible in the context of multi-kW SST applications (e.g., 45 kW in an embodiment used for simulations, described below). The timing waveforms used to control the MOSFET drivers can be generated by a microcontroller to enable smart features such as closed-loop voltage regulation (discussed in detail later). However, such smart features need not be implemented via a centralized control system that can be hacked into by cyber attackers. Features such as closed-loop voltage regulation can be implemented via measurement of local observables, requiring no communication with the outside world if such decoupling is deemed desirable.

Figure 3:
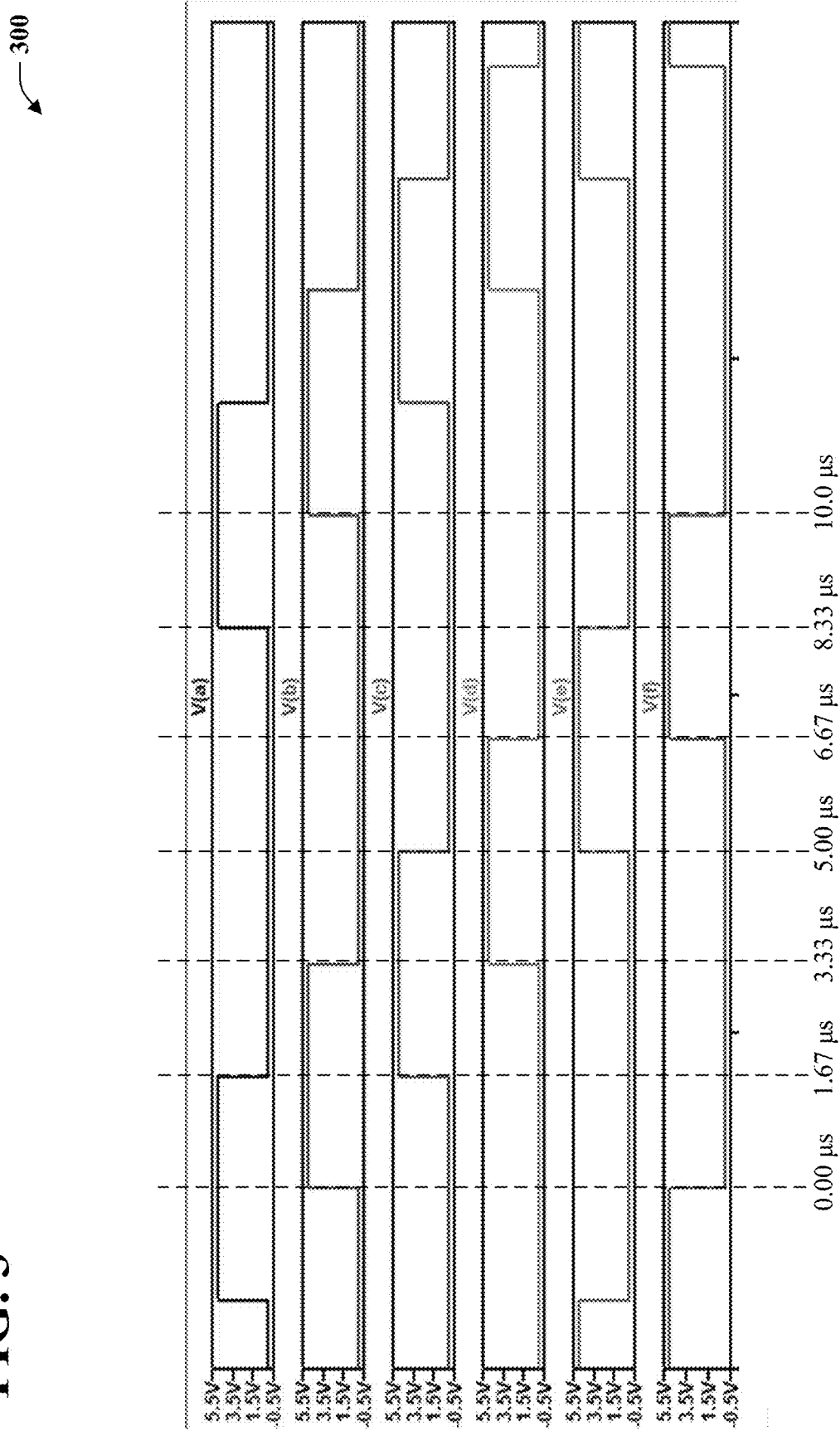
FIG. 3 is a plot of exemplary switch control waveforms.

With reference now to FIG. 3, a plot 300 of exemplary MOSFET driver control signals is shown for a 10 μs switching sequence. From 0.00 μs to about 1.67 μs, signals A and B take high logic values, thereby causing the switches 4QS1, 4QS7, 4QS5, and 4QS11 to close. From about 1.67 μs to about 3.33 μs, signal A takes a low logic value causing switches 4QS1 and 4QS7 to open, whereas signal C takes a high logic value causing switches 4QS3 and 4QS9 to close. From about 3.33 μs to about 5 μs, signal B takes a low logic value causing switches 4QS5 and 4QS11 to open, whereas signal D takes a high logic value causing switches 4QS4 and 4QS10 to close. From about 5.00 μs to about 6.67 μs, signal C takes a low logic value causing switches 4QS3 and 4QS9 to open, whereas signal E takes a high logic value causing switches 4QS2 and 4QS8 to close. From about 6.67 μs to about 8.33 μs, signal D takes a low logic value causing switches 4QS4 and 4QS10 to open, whereas signal F takes a high logic value causing switches 4QS6 and 4QS12 to close. Completing the sequence, from 8.33 μs to about 10 μs, signal E takes a low logic value causing switches 4QS2 and 4QS8 to open, whereas signal A takes a high logic value again, causing switches 4QS1 and 4QS7 to close. The sequence then repeats. At any given time, 2 of 3 phases are connected to the transformer winding, and one phase is left floating. During the 1.67 μs interval that a phase is left disconnected, voltage collapse is prevented by the small amount of energy stored in the EMI filter (which is replenished during the subsequent 3.33 μs interval), which is described in greater detail below. As a result, the fundamental frequency for current sourcing/sinking is 200 kHz, despite the fact that each of the 4-quadrant switches 4QS1-4QS12 is only being cycled on/off at 100 kHz.

Figure 4A:
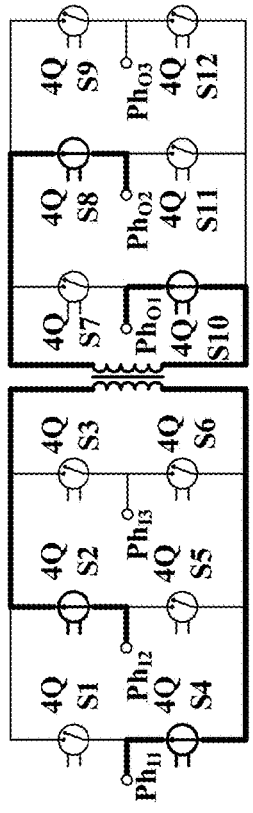
FIGS. 4A-4F are schematic diagrams illustrating a current routing sequence of the exemplary SST corresponding to the switch control waveforms illustrated in FIG. 3.

The current routing sequence in the SST 100 that corresponds to the control signal pattern illustrated in FIG. 3 is shown in FIGS. 4A-4F. FIG. 4A shows the current path during the interval from 0.00 μs to about 1.67 μs. In that interval, current flows from/to the first phase input $Ph_{I1}$ through 4QS1, to the primary winding 104, and through 4QS5 from/to $Ph_{I2}$. On the secondary side, current flows to/from the first phase output $Ph_{O1}$, through switch 4QS7, through the secondary winding 106, and through 4QS11 to the second phase output $Ph_{O2}$.

Figure 4B:
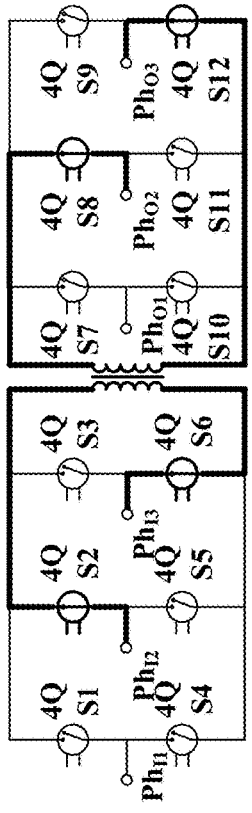

FIG. 4B shows the current path during the interval from about 1.67 μs to about 3.33 μs. In this interval, current flows from/to the second phase input $Ph_{I2}$ through 4QS5, to the primary winding 104, and through 4QS3 to/from $Ph_{I3}$. On the secondary side, current flows from/to the second output phase $Ph_{O2}$ through 4QS11, to the secondary winding 106, through switch 4QS9 and to/from the third output phase $Ph_{O3}$.

Figure 4C:
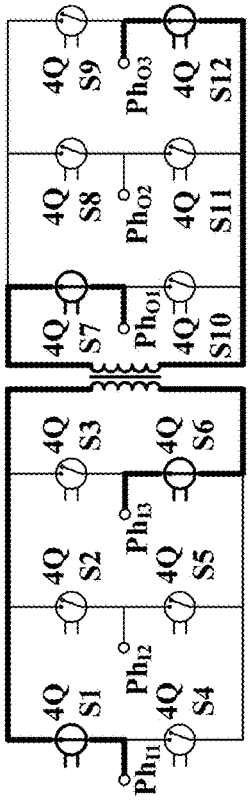

FIG. 4C shows the current path during the interval from about 3.33 μs to about 5 μs. In this interval, current flows from/to the third phase input $Ph_{I3}$ through 4QS3, through the primary winding 104, through 4QS4 and to/from the first phase input $Ph_{I1}$. On the secondary side, current flows from/to the third output phase $Ph_{O3}$ through 4QS9, through the secondary winding 106, through switch 4QS10, and to/from the first output phase $Ph_{O1}$.

Figure 4D:
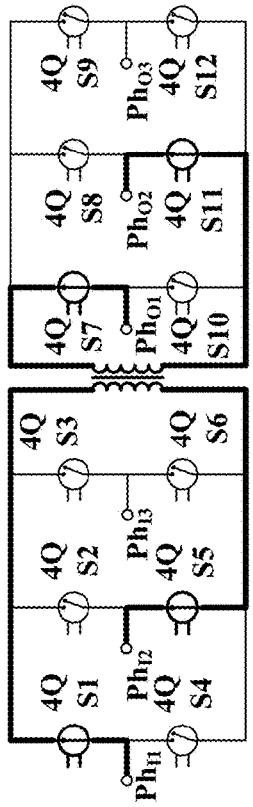

FIG. 4D shows the current path during the interval from about 5 μs to about 6.67 μs. In this interval, current flows from/to the first phase input $Ph_{I1}$ through the switch 4QS4 to the primary winding 104, through the switch 4QS2 and to/from the second phase input $Ph_{I2}$. On the secondary side, current flows from/to the first output phase $Ph_{O1}$ through the switch 4QS10, through the secondary winding 106, through the switch 4QS8 and to/from the second phase output $Ph_{O2}$.

Figure 4E:
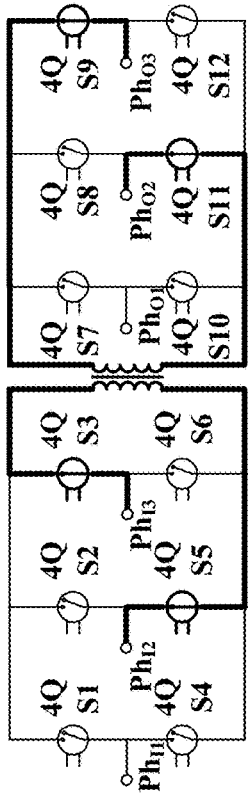

FIG. 4E shows the current path during the interval from about 6.67 μs to about 8.33 μs. In this interval, current flows from/to the second phase input $Ph_{I2}$ through the switch 4QS2, through the primary winding 104, through the switch 4QS6, and to/from the third phase input $Ph_{I3}$. On the secondary side, current flows from/to the second phase output $Ph_{O2}$ through the switch 4QS8, through the secondary winding 106, through the switch 4QS12, and to/from the third phase output $Ph_{O3}$.

Figure 4F:
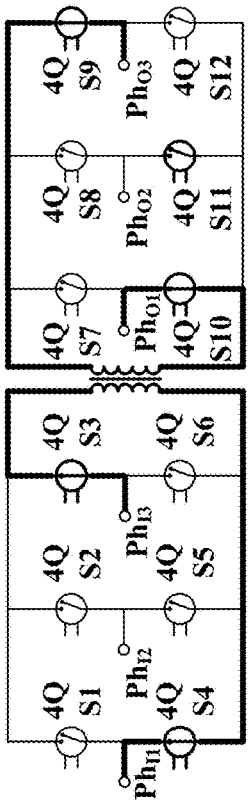

FIG. 4F shows the current path during the interval from about 8.33 μs to about 10 μs. In this interval, current flows from/to the third phase input $Ph_{I3}$ through the switch 4QS6, through the primary winding 104, through the switch 4QS1 and to/from the first phase input $Ph_{I1}$. On the secondary side, current flows from/to the third phase output $Ph_{O3}$, through switch 4QS12, through the secondary winding 106, through switch 4QS7, and to/from the first phase output $Ph_{O1}$.

The polarity between the excitation voltage sequence applied to the primary winding 104 during the first half interval 0 μs≤t<5 μs and the second half interval 5 μs≤t<10 μs of the sequence is reversed. For example, in the fourth configuration of the sequence depicted in FIG. 4D, the voltage at the primary winding 104 is $V_2(t)-V_1(t)$ as opposed to $V_1(t)-V_2(t)$ in the first configuration of the sequence depicted in FIG. 4A. The resulting 100 kHz balanced AC waveform is transmitted through the transformer core 102 to provide the desired functions of voltage step-up/down and galvanic isolation. For the same reason, common-mode DC offsets such as those generated by Coronal Mass Discharge (CMD) and electromagnetic pulse (EMP) events that can destroy conventional transformers via core saturation do not substantially affect operation of the LMI3 SST.

In the exemplary embodiment described herein, the time dependent magnetic flux density waveform B(t) present in the transformer core 102 is a 100 kHz, roughly sinusoidal waveform, having small amplitude modulation (e.g., modulation index of less than 25%, less than 15%, or less than 10%). This is in stark contrast to the 100%-modulation-index B(t) waveform resulting from square-wave modulation of a single AC phase (e.g., as in the McMurray architecture). Another important property of the LMI3 architecture is that the current draw waveform for each phase has a very high fundamental frequency (200 kHz when the switches 4QS1-4QS12 have a switching frequency of 100 kHz). This is despite the MOSFETS and MOSFET drivers toggling at only 100 kHz, and application of a 100 kHz B(t) waveform to the transformer core 102.

Figure 5:
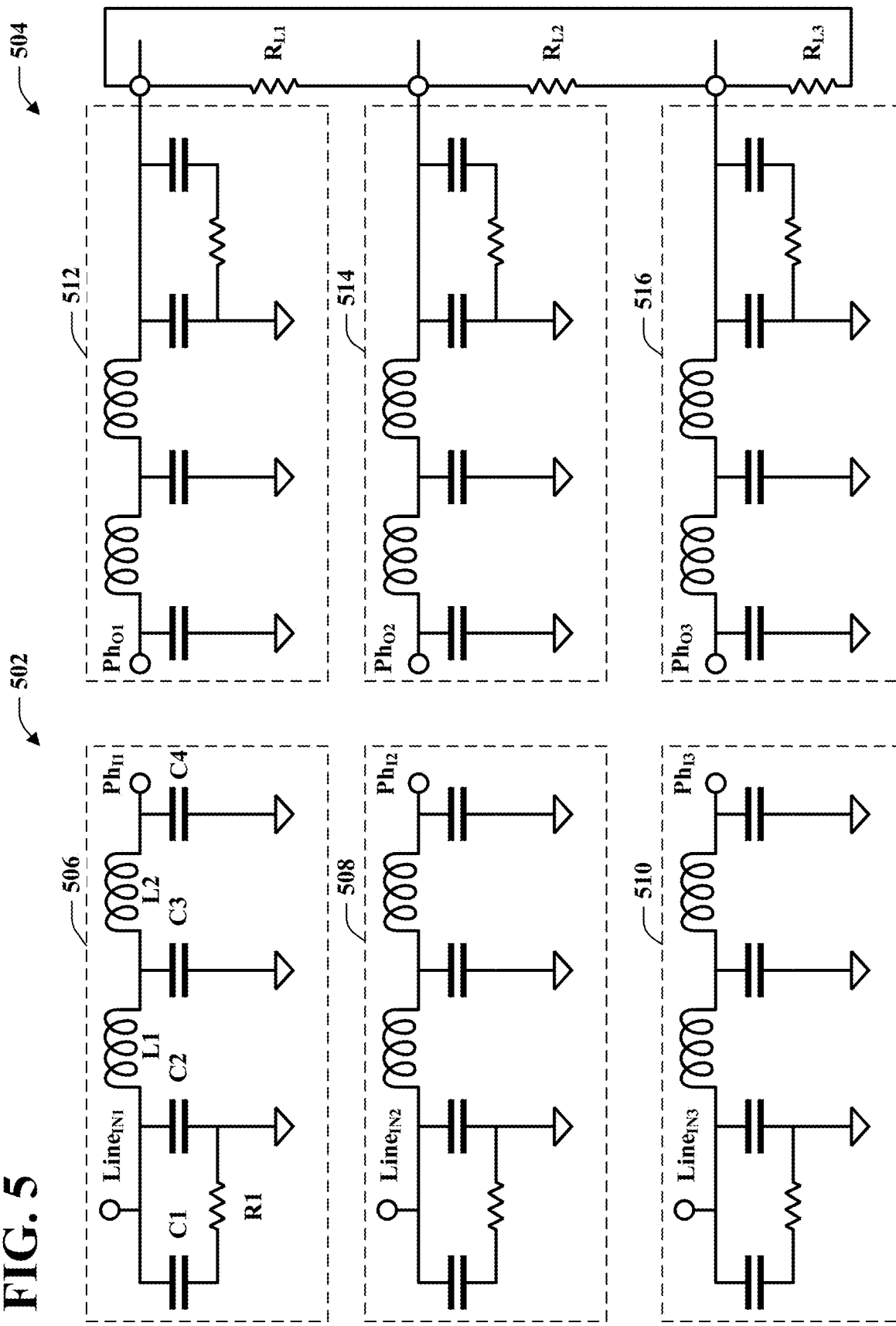
FIG. 5 is a schematic diagram of exemplary filter banks that can be incorporated into the SST of FIG. 1.

With reference now to FIG. 5, exemplary filter banks 502, 504 that are configured for use with the SST 100 are shown. As used herein, it is to be understood that the filter banks 502, 504 can be considered to be components of the SST 100 and in various embodiments can be included integrally with other components of the SST 100. The filter bank 502 is configured to be connected to the primary-side switch bank 108, and the filter bank 504 is configured to be connected to the secondary-side switch bank 110. These filter banks 502, 504 are used to ensure that high-frequency current waveforms only circulate in the immediate vicinity of the MOSFET switches 4QS1-4QS12 and are not substantially coupled to the 50/60 Hz AC mains or the 50/60 Hz load. Each of the filter banks 502, 504 comprises three filters, one for each of three phases of the SST 100. The filter bank 502 comprises filters 506-510, and the filter bank 504 comprises filters 512-516. The filter bank 502 comprises input ports Line$_{IN1}$, Line$_{IN2}$, Line$_{IN3}$ which each correspond to a different phase of a three-phase electrical input. The filter bank 502 comprises output ports that are configured to be connected to the three-phase inputs Ph$_{I1}$, Ph$_{I2}$, and Ph$_{I3}$ of the SST 100. Similarly, the filter bank 504 comprises input ports that are connected to the output phases Ph$_{O1}$, Ph$_{O2}$, and Ph$_{O3}$ of the SST 100. The filter bank 504 comprises output ports Line$_{OUT1}$, Line$_{OUT2}$, Line$_{OUT3}$ that are configured to be connected to the three-phases of a three-phase load (represented in FIG. 5 as R$_{L1}$, R$_{L2}$, R$_{L3}$).

The exemplary filters 506-516 are 5-pole LC filters. For example, the filter 506 comprises capacitors C1 and C2 that are connected to a first phase input line voltage Line$_{IN1}$ (e.g., a first phase of electrical service mains from a transmission line). The terminals of the capacitors C1 and C2 that are not connected to the Line$_{IN1}$ are connected by way of a resistor R1. The capacitor C1 and resistor R1 are included to provide damping of the LC filter 506 without dissipating significant power. The filter 506 further comprises an inductor L1 that is connected to Line$_{IN1}$. A second terminal of the inductor L1 is connected to a capacitor C3 and a second inductor L2. The second terminal of capacitor C3 is connected to a same neutral potential as the terminal of C2 that is not connected to Line$_{IN1}$. The second inductor L2 is connected to a capacitor C4 at filter output terminal Ph$_{I1}$. The second terminal of capacitor C4 is then also connected to the neutral potential. The filters 508-516 can be similarly constructed, mutatis mutandis, as shown in FIG. 5.

In exemplary embodiments, the filters 506-516 have a 3 dB cutoff frequency of ~65 kHz, ~60 dB of rejection at 200 kHz (i.e., the fundamental EMI frequency for a switching frequency of 100 kHz in the SST 100), and 80 dB/decade roll off. Because the periodic waveform for current draw occurs at 200 kHz in the 100 kHz-switching embodiment described herein, the capacitor size required for filters 506-516 can be kept small. For instance, the capacitors C1-C4 can each have capacitance values of about 8 μF in a 45-kW-rated representative embodiment of the SST 100. Values of other passive components used in each of the 5-pole EMI filters 506-516 can be kept similarly small. For example, the inductor size used in a 45-kW representative embodiment has an inductance of only about 3.3 μF and a series resistance of about 0.40 milliohms. The small inductors save on size and cost of the SST 100 compared to designs requiring larger inductors. The low capacitance values required allow unreliable electrolytic capacitors to be omitted from the SST 100. Instead polypropylene film capacitors and/or ceramic capacitors can be used for capacitors included in the filters 506-516.

It should be understood that the EMI filters 506-516 shown in FIG. 5 are not necessarily carefully optimized for all applications, and that numerous design and component size/cost tradeoffs may be contemplated as being within the scope of the present disclosure. In various other embodiments, the filters 506-516 can be configured to have a 3 dB cutoff frequency at 90% of the switching frequency of the SST 100, at 75% of the switching frequency of the SST 100, or 50% of the switching frequency of the SST 100.

The SST 100 described above is configured to have a 3-wire delta configuration on its primary and secondary sides. However, the LMI3 SST 100 can also be configured to have a star point for 4-wire service (Y-configuration). A 3-wire delta secondary provides galvanic isolation and establishes a well-defined differential voltage relationship between its three output leads, phases X, Y, and Z. It does not however, place any constraint on the common mode voltage present on the X, Y, and Z terminals with respect to any voltage reference point, such as earth ground. All that can be said is that there is a common mode voltage present on all three terminals that is equal to the (instantaneous) arithmetic mean of Vx(t), Vy(t), and Vz(t). In a four-wire balanced three-phase system, there is a star point (that typically gets bonded to the neutral conductor) present whose potential is equal to the common-mode XYZ voltage. In addition to having an instantaneous voltage equal to the arithmetic mean of Vx(t), Vy(t), and Vz(t), this star point may be connected to earth ground, or any other reference voltage desired because the transformer secondary is galvanically isolated. To create a star point for a three-phase delta transformer secondary, a circuit node is needed whose potential is equal to the arithmetic mean of Vx(t), Vy(t), and Vz(t), and that is connected to nodes X, Y, and Z in a manner that can source/sink a large amount of current at 50/60 Hz. The usual solution is to employ what is known as a 3-phase zig-zag "grounding transformer" designed specifically for this purpose. The problem with such grounding transformers is that they tend to be very large and expensive.

In many conventional transformer designs, bonding a neutral conductor directly to a center tap of a transformer winding is appropriate to yield a star point. However, the output terminals Ph$_{O1}$, Ph$_{O2}$, and Ph$_{O3}$ of the SST 100 naturally constitute a 3-wire delta configuration. Moreover, the transformer secondary 106 comprises a single-phase winding through which power from multiple phases pass sequentially. Thus, the voltages present on the two leads of the secondary winding 106 are not simple 50/60 Hz waveforms, and it is not immediately clear that a neutral wire can be created by bonding a conductor directly to a center tap on the secondary winding 106 of the SST 100.

For purpose of explaining embodiments adapted to star point generation, a hypothetical experiment is now described. A 10Ω resistor is connected to each of the Ph$_{O1}$, Ph$_{O2}$, and Ph$_{O3}$ output terminals of the 3-wire delta SST 100. The opposite ends of the three 10Ω resistors are then connected together to artificially create a star point, and this star point can then be connected to ground. This star point is a node whose potential is equal to the common mode voltage of the X, Y, and Z phases (i.e., the phases output at Ph$_{O1}$, Ph$_{O2}$, and Ph$_{O3}$ terminals, respectively), and its voltage is set to a reference point, V=0. In an exemplary embodiment wherein a phase-to-phase voltage applied to the primary winding 104 is 480 VAC rms, the time-dependent potentials of the Ph$_{O1}$, Ph$_{O2}$, and Ph$_{O3}$ terminals oscillate sinusoidally with an rms amplitude of 277 VAC about the reference potential V=0 of the star point.

Figure 6:
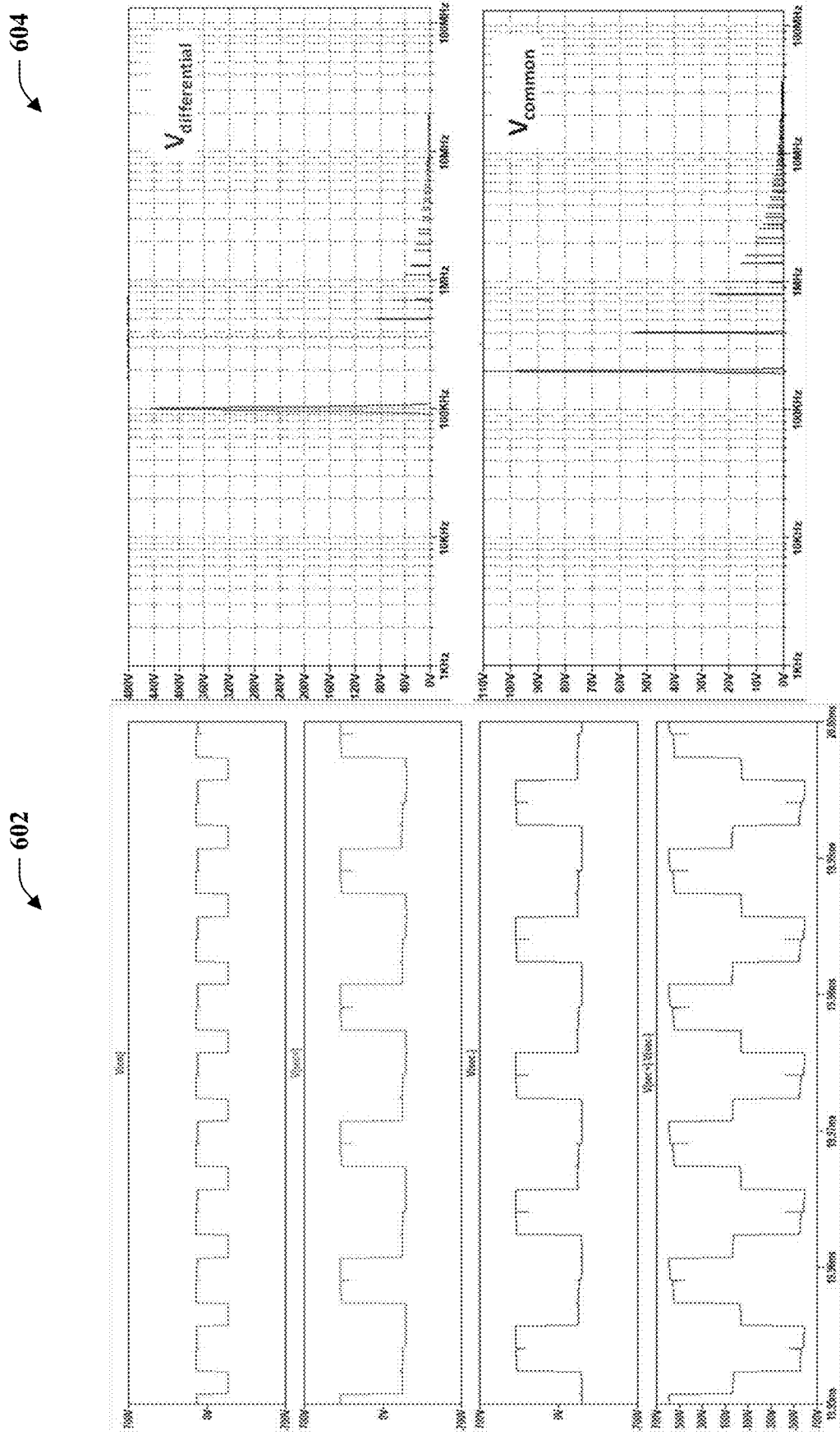
FIG. 6 includes various plots of simulated common and differential voltages at a secondary winding of an SST.

When the SST 100 is operating in the above manner, the voltage present at a hypothetical center tap of the secondary winding 106 with respect to this star point can be taken as the instantaneous arithmetic mean of the voltages present at nodes SEC+ and SEC− at either end of the secondary winding 106. Simulated waveforms are plotted 602 in FIG. 6, along with spectra 604 of the common and differential voltages. The common mode voltage V$_{cm}$ at the hypothetical center tap is a high frequency AC waveform with a fundamental frequency of 200 kHz and no DC component. Therefore, V$_{cm}$(t)≠0 in general, but the time-averaged value of V$_{cm}$(t)=0, including when such an average is taken over an interval much shorter than the period of 50/60 Hz line voltage (e.g. 1 ms). This indicates that a time-averaged version of V$_{cm}$ present at the center tap can be safely connected to the grounded star point.

In embodiments wherein the switching frequency of the SST 100 is 100 kHz, this can be done using an inductor that functions as a low-pass filter of cutoff frequency 50/60

Hz<<$f_c$=(2 πL)/R<<200 kHz, where L is the inductance of the inductor, and R is the winding resistance of the inductor. R must be chosen low enough to provide a low impedance path for return currents at 50/60 Hz (e.g. tens of me), and L must be large enough to prevent significant power dissipation as a result of reactive current flowing back and forth in the inductor. These requirements determine the size of the inductor core. In embodiments wherein the switching frequency of the SST 100 is 100 kHz, this inductor can be made quite small and inexpensive because the lowest frequency of the common mode voltage waveform present at the center tap is 200 kHz. If the center point of the secondary winding 106 is connected through a suitable inductor to a ground, the hypothetical Y network of 10Ω resistors described above could be removed, and the sinusoidal waveforms present at terminals $Ph_{O1}$, $Ph_{O2}$, and $Ph_{O3}$ would remain centered about ground. Accordingly, a large and expensive zig-zag grounding transformer is not necessary to provide a 4-wire service with the SST 100.

Figure 7:
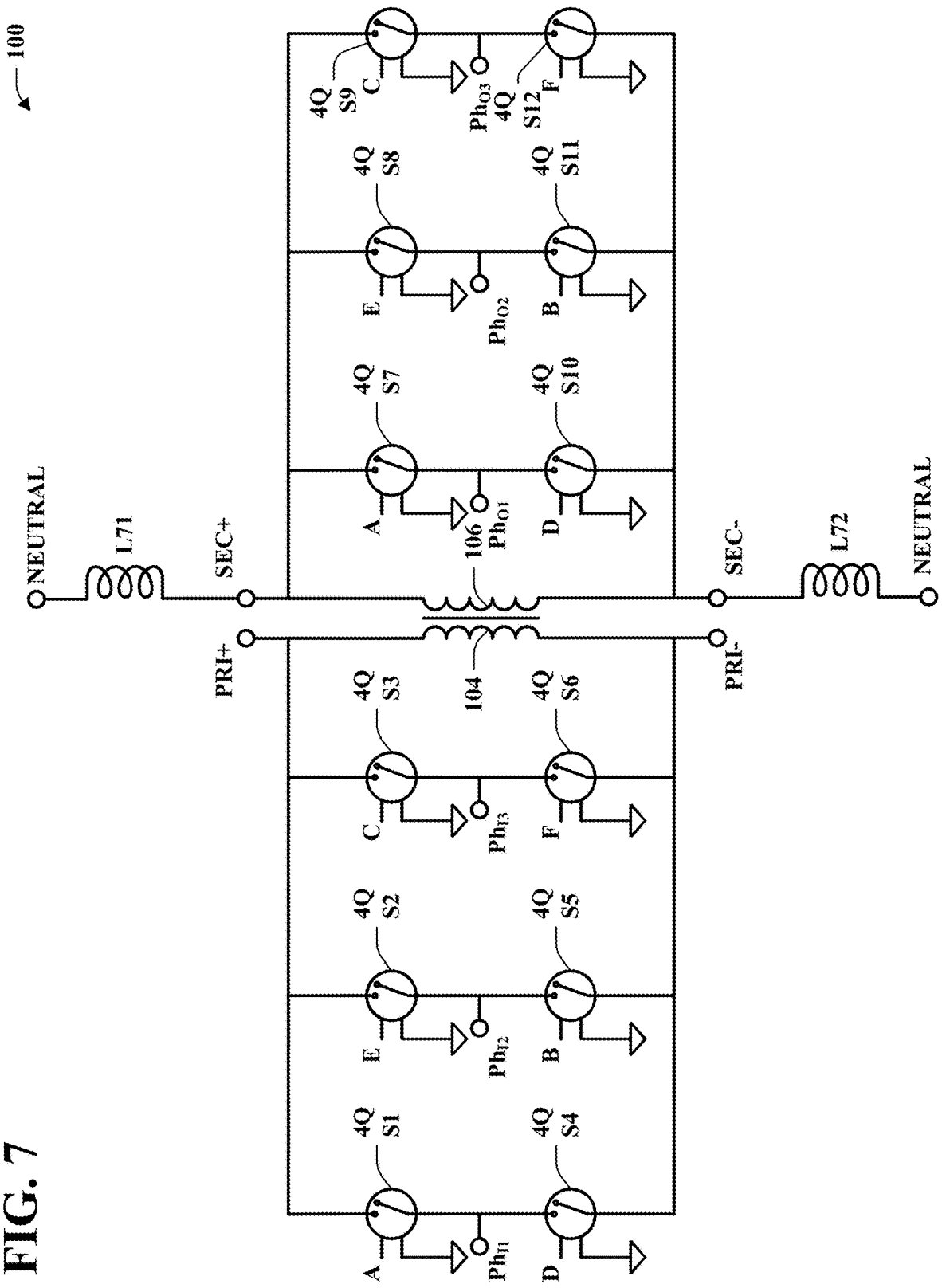
FIG. 7 is a schematic diagram of an exemplary SST configured for 4-wire service.

If no center tap of the secondary winding 106 is used, two identical inductors, one connected from SEC+ to the star point, and one connected from SEC− to the star point could instead be used. In this case, the inductors are selected to present high impedance to both the common mode and differential voltages present on the secondary winding 106, so that no substantial power dissipation occurs as a result of reactive current flowing back and forth through the inductors. However, because of the high frequency waveforms involved (e.g., about 200 kHz for a 100 kHz switching frequency of the SST 100), such inductors are not prohibitively large or expensive. By way of an example, and referring now to FIG. 7, the above star point arrangement can be implemented using two inductors L71, L72, wherein L71 is connected to SEC+ and L72 is connected to SEC−. In an exemplary embodiment, the inductors L71, L72 can have values of 340 pH and 50 mΩ rated for 15 A. This is equivalent to connecting the center tap to the star point with a single 170 μH, 25 mΩ inductor with a current rating of 30 A.

Figure 8:
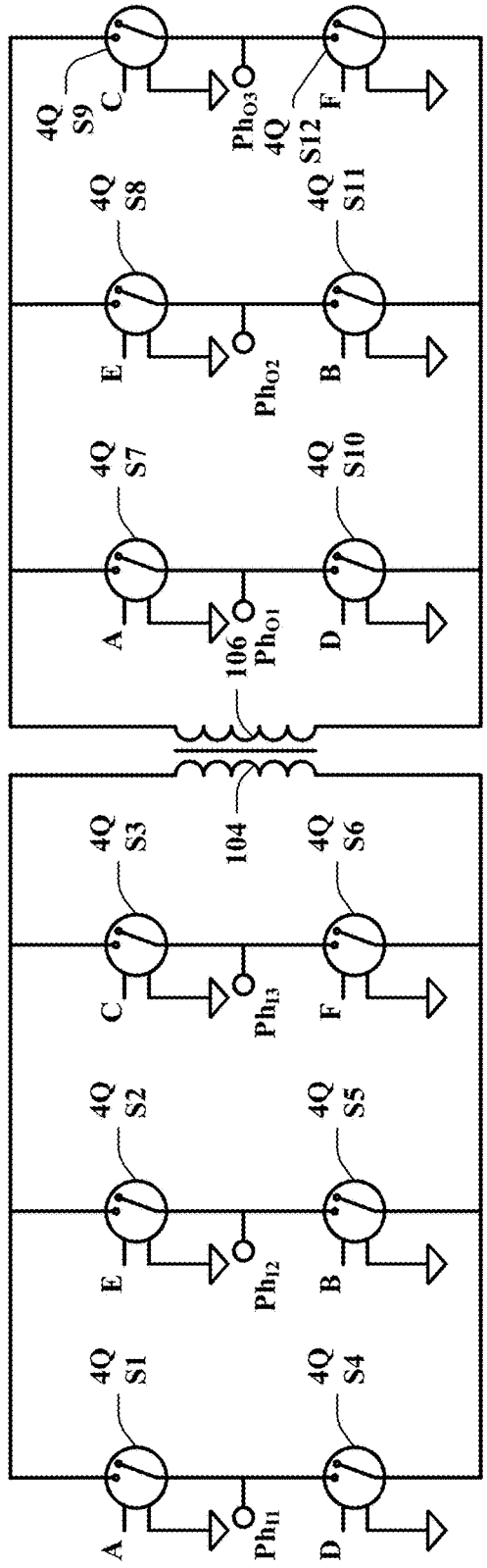
FIG. 8 is a schematic diagram illustrating a pair of SSTs configured to be operated as components of a combination SST.
Figure 8:
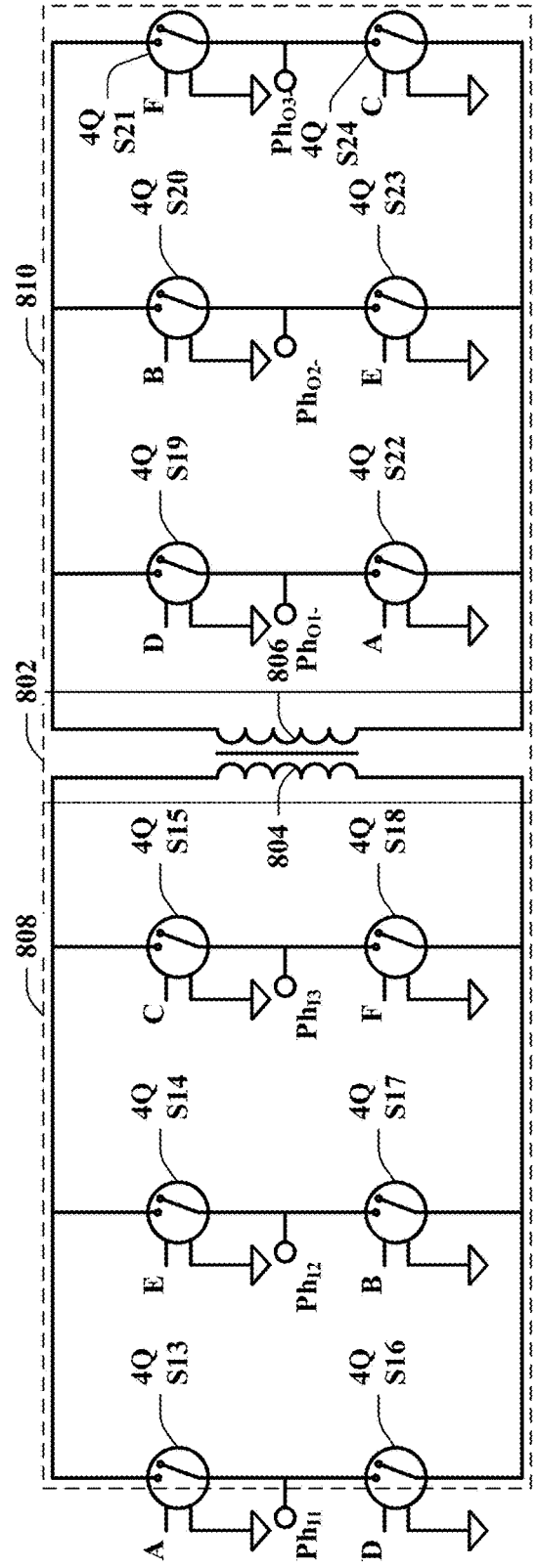

SSTs described herein can further be combined to yield a combination transformer that is capable of handling greater voltage and/or power than either of the component SSTs individually. By way of example, and referring now to FIG. 8, the SST 100 and a second SST 800 are illustrated and are connected in parallel on one side (e.g., the primary side), and in series on the other side (e.g., the secondary side), to create a 2:1 step up transformer without resorting to the use of higher voltage MOSFETs. In an exemplary embodiment, the SST 100 can be a 45-kVA transformer and the SST 800 can be a 45-kVA transformer such that the combination of the two is a 90-kVA effective combination transformer. It is to be understood that a power or voltage rating of an SST described herein will depend on its construction, and accordingly that the power or voltage rating of a combination of SSTs will depend on the ratings of its component SSTs.

The SST 800 is constructed in substantially similar fashion to the SST 100 and includes a transformer core 802 that comprises a primary winding 804 and a secondary winding 806, a primary-side switch bank 808 that includes switches 4QS13-4QS18, and a secondary-side switch bank 810 that includes switches 4QS19-4QS24. In the SST 800, gate driver signal transpositions are made in the secondary-side switch bank 810 as compared to the SST 100 to phase shift the 3-phase sinusoidal output by 180 degrees (A↔D, B↔E, and C↔F), yielding 3-phase outputs $Ph_{O1-}$, $Ph_{O2-}$ and $Ph_{O3-}$.

Figure 9:
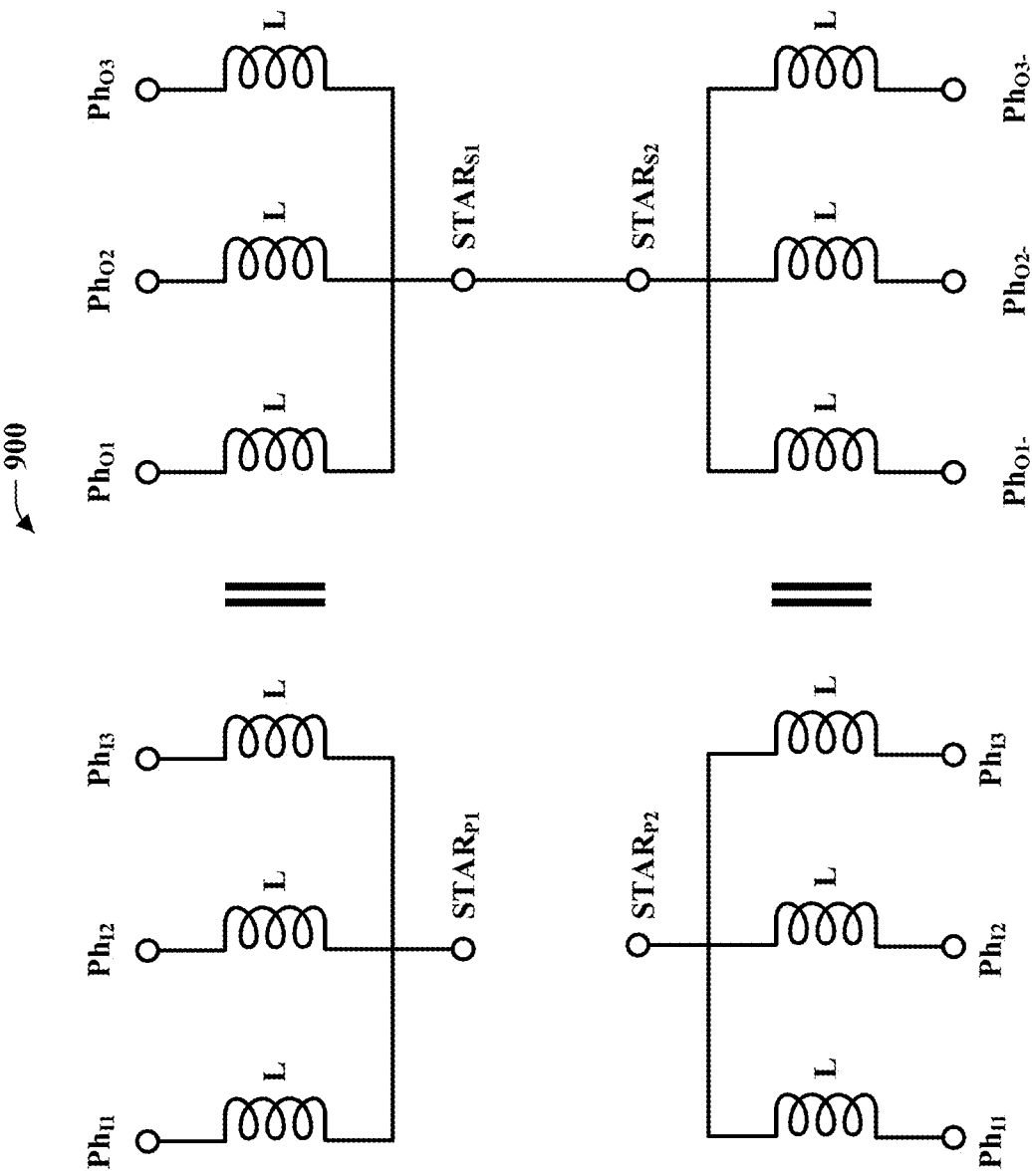
FIG. 9 is a schematic diagram of interconnections between the pair of SSTs depicted in FIG. 8.

Referring now to FIG. 9, a schematic diagram 900 of connections between the transformers 100, 800 is presented. The inductors L are star point filter inductors that function in a similar manner to the star point inductors discussed above with respect to FIG. 7 in regard to a 4-wire output of the SST 100. On the primary side, the star point $STAR_{S1}$ of the first transformer 100 and the star point $STAR_{P2}$ of the second transformer 800 are left floating. On the high-voltage secondary side, the star point $STAR_{S1}$ of the first transformer 100 and the star point $STAR_{S2}$ of the second transformer 800 are tied together to create a series, back-to-back connection. In such a series connected arrangement, splitting of voltage evenly between the two series-connected transformers is automatically enforced by conservation of charge at 50/60 Hz. There is no need to synchronize system clocks or MOSFET switching times between the two SSTs 100, 800. Synchronization/interconnection between the transformers 100, 800 is done at 50/60 Hz input/output terminals (in similar fashion to cascading conventional transformers). No routing of high-speed signals or other form of communication is required between the two SST modules.

As pointed out above, such a series-connected arrangement allows a 2:1 step up transformer to be created without resorting to the use of higher voltage MOSFETs than required for the SSTs 100, 800 individually. Another strategy to achieve the same objective is to construct a single 90-kVA LMI3-SST in which each 4-quadrant switch in the SST 100 is replaced by two 4-quadrant switches in series (keeping in mind that the size of transformer core will also need to be increased). Using series strings of semiconductor switches to access higher operating voltages can be difficult, however, because the condition that the voltage drop across the string of switches is divided roughly equally must be enforced, otherwise one or more switches may be destroyed. Since these switches do not constitute simple two-terminal ohmic devices of nominally identical construction for which equal voltage sharing is automatically enforced by conservation of charge, this condition is not trivial to ensure.

Other configurations of multiple transformers working in combination are contemplated as being within the scope of the present disclosure. The SST 100 can be combined with similarly constructed SSTs in various series and parallel combinations to address any of a variety of transformer applications.

Figure 10:
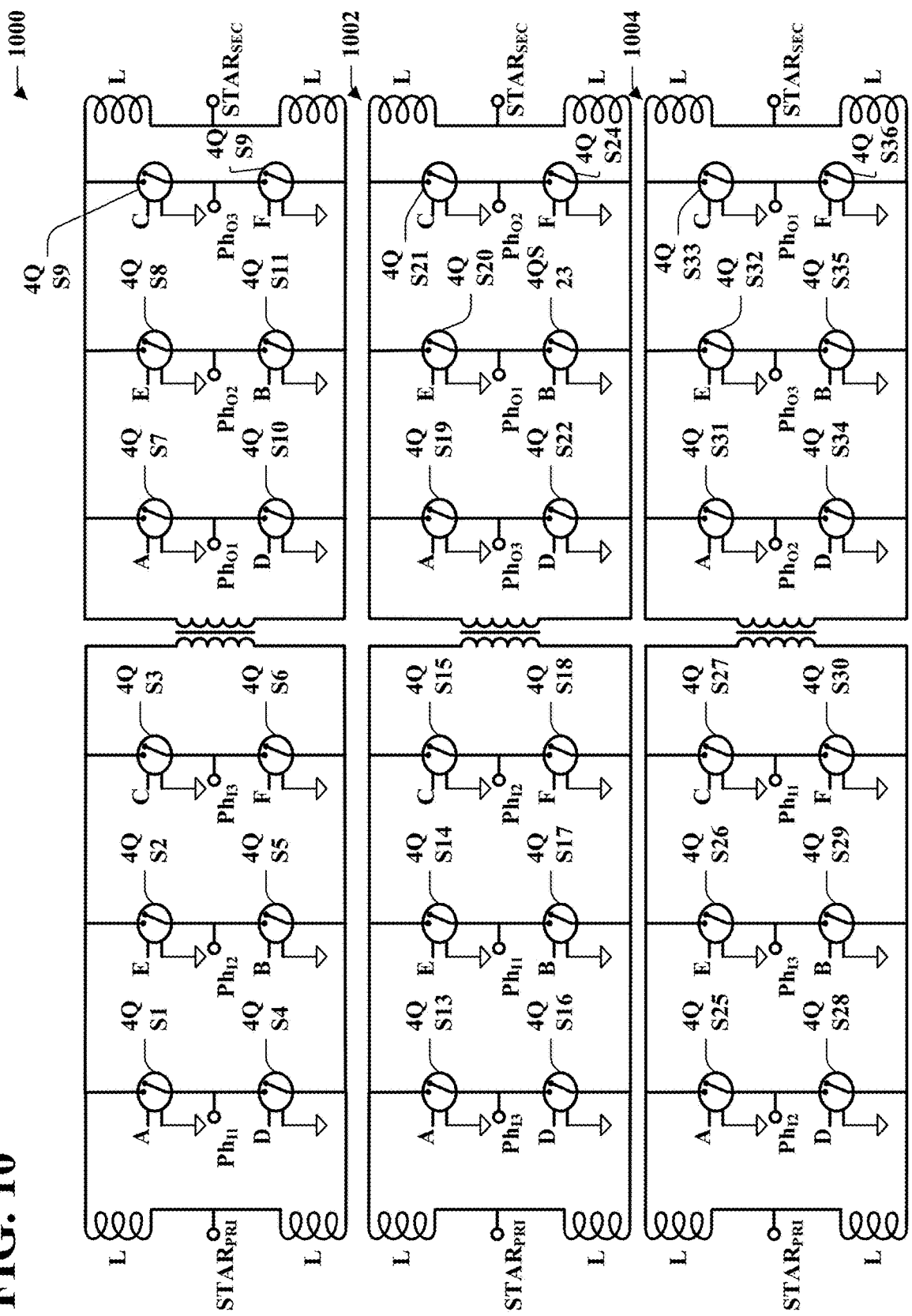
FIG. 10 is a schematic diagram of an exemplary SST formed from a combination of three interconnected SSTs.

In various embodiments, multiple SSTs can be connected to share common input and output EMI filters and the switching sequences of their switch banks interleaved in switching sequence. Referring now to FIG. 10, three SSTs 1000, 1002, and 1004 are depicted. The SSTs 1000, 1002, 1004 are connected to one another by way of their respective star points on the primary side ($STAR_{PRI}$) and the secondary side ($STAR_{SEC}$). Thus, if each of the SSTs 1000, 1002, 1004 is a 45 kVA-rated SST, the parallel-connected combination of the SSTs 1000, 1002, 1004 can be employed as a 135-kVA SST. The SSTs 1000, 1002, 1004 share common input and output EMI filters (e.g., the filter banks 502, 504). The SSTs 1000, 1002, 1004 have a staggered switching sequence accomplished by keeping control signals A-F in the same positions in each of the SSTs 1000, 1002, 1004 but permuting the signals $Ph_{I1}$, $Ph_{I2}$, $Ph_{I3}$, $Ph_{O1}$, $Ph_{O2}$, and $Ph_{O3}$. Thus, across the three SSTs 1000, 1002, 1004, the switches controlled by a same control signal are each connected to a different phase. To further illustrate, the switches 4QS1, 4QS13, and 4QS25 are toggled by a same control signal A, but 4QS1 is connected to phase $Ph_{I1}$, 4QS13 is connected to phase $Ph_{I3}$, and 4QS25 is connected to $Ph_{I2}$. For a switching frequency of 100 kHz, at each of the phase input and output terminals $Ph_{I1}$, $Ph_{I2}$, $Ph_{I3}$, $Ph_{O1}$, $Ph_{O2}$, and $Ph_{O3}$, this sequencing creates three 200 kHz EMI waveforms staggered in time, whose superposition is a 600 kHz EMI signal with markedly reduced amplitude as compared to the individual 200 kHz waveforms. The 600 kHz EMI allows smaller and less expensive components to be used in the EMI filters 502, 504. For instance, to achieve similar reduction in EMI amplitude passed to the input mains or the load as discussed above with respect to the SST 100, with respect to the SSTs 1000, 1002, 1004, 2.2 g capacitors can be used in the three capacitive legs of the EMI filter filters 502, 504, and inductor size can be reduced from 3.3 pH to 2.2 pH, with increased inductor current capacity. As will be shown in simulation results discussed below, the outermost (viewed from the SST) and middle EMI filter capacitors experience low stress, allowing ordinary film capacitors to be used.

In an exemplary embodiment, to contend with the 600 kHz EMI waveform, innermost EMI filter capacitor (e.g., capacitor C4 in EMI filter circuit 506) may comprise an array of 22 0.10 µg, COG-dielectric ($CaZrO_3$) surface mount capacitors, each of which is rated for 6.3 A rms of ripple current at 1 MHz. The use of such a capacitor array can be employed when dealing with very high values of dI/dt, because forcing current to flow in a low-aspect-ratio sheet achieves extremely low series inductance. To alleviate component layout congestion, the ensemble of surface mount capacitors can be divided between the top and bottom sides of a printed circuit board, and two capacitors can be stacked on top of each other at each footprint location without a significant reduction in performance.

The reduction in capacitance values of the EMI filter confers another important benefit as well. The step function response of an EMI filter shared by the combination is more highly damped than for an EMI filter because the C/L ratio of the LC filters in the EMI filter can be decreased. As will be described in greater detail below, simulation results indicate that abrupt turn on of three-phase line voltage to a parallel combination of SSTs like that shown in FIG. 10 results in no voltage or current overshoot. This obviates the need for current inrush limiting components.

Conventional fixed-turn-ratio transformers have certain intrinsic limitations with regard to voltage regulation. The application of a heavy electrical load to a conventional transformer results in certain amount of voltage droop. In effect the transformer is forming a voltage divider with the load impedance. Non-idealities such as leakage inductance and winding resistance contribute to this problem. The amount of voltage drop that can be tolerated by end use applications is regulated accordingly. In a conventional transformer, on load tap changers (OLTCs) are used to address this problem, keeping line voltage approximately constant despite wide variations in the load impedance seen by the mains (e.g. over the course of a 24-hour cycle). These systems usually possess 33 taps (one at-center "Rated" tap and sixteen to increase and decrease the turn ratio) and allow for ±10% variation (each step providing 0.625% variation) from the nominal transformer rating which, in turn, allows for stepped voltage regulation of the output.

In exemplary embodiments, the SST 100 can be configured to provide a comparable ±10% adjustment in the effective turns ratio between the primary winding 104 and the secondary winding 106. Modification of the effective turns ratio between the primary 104 and secondary 106 can be accomplished with a pair of 4-quadrant switches. For example, and with reference now to FIG. 11, a pair of exemplary coils 1100, 1102 of an SST are shown. The primary coil 1100 has 10 turns. The secondary coil 1102 has 11 turns, and a pair of 4-quadrant switch 1104, 1105 (depicted as single-pole, single-throw switches) is used to toggle between a first tap 1106 at the $11^{th}$ turn and a second tap 1108 at the $9^{th}$ turn. Accordingly, the turns ratio of the coils 1100, 1102 can be modified by actuation of the switches 1104, 1105. The switches 1104, 1105 can be actuated such that only one of the switches 1104, 1105 is in a conducting state at a given time. It will also be understood that the 4-quadrant switches in question need not have nearly as high a voltage rating as the 4-quadrant switches used in the switch banks 108, 110. Timing the toggling of the switches 1104, 1105 at the current zero-crossing point provides a glitch-free transition between N=9 and N=11 turns without significant MOSFET switching loss.

Referring once again to FIG. 1, another way to adjust the effective turns ratio of the windings 104, 106 is to manipulate the duty cycle of the gate driver waveforms A-F. Thus far it has been assumed that during each 3.33 µs interval in which a 4-quadrant switch is eligible to be in its conducting state, it is in fact turned on 100% of the time. Instead, turn on of each switch, A-F can be delayed for a portion (e.g., the first 0.33 µs) of its respective "eligibility interval". If this delay is 10% of the eligibility interval, the load voltage decreases to 90% of its previous value. Moreover, predetermined changes in duty cycle can be made extremely quickly, in small increments at each successive clock cycle.

This implies that if a transition is made between step-up and step-down transformer mode during the course of a single 100 kHz cycle (e.g., as described above with respect to FIG. 11), the duty cycle can also be transitioned in six, 1.67-µs-duration steps to maintain constant load voltage. This allows a smooth shift between N=9 and N=11 turns, after which the duty cycle can be continually manipulated to maintain constant voltage under changing load. The very small voltage disturbances occurring during a 10 µs shift sequence generate high frequency signals that are strongly attenuated by the EMI filters 502, 504. It will be noted that variation of the duty cycle to achieve smooth tap changing may benefit from a combination of feed forward and feedback control in some instances.

If EMI generated by disconnecting one side of the inductive load at the beginning of each deadtime interval is problematic in a given application, an alternative switching sequence can be employed that ensures that both sides of the inductive load are at all times connected to well-defined voltage levels. For example, and referring back to the six-step switching sequence shown in FIGS. 3 and 4, during the interval 0≤t≤3.33 µs, a transition can be made between states 1 and 2 (i.e., those shown in FIGS. 4A and 4B) through an intermediate "state 1.5" that corresponds to the deadtime interval, during which time switches 4QS2 and 4QS5 are closed. This would make the voltage across the primary winding 104 zero during the deadtime interval and prevent any inductive flyback effect from occurring. To implement this scheme, the MOSFETs would be toggled twice every 10-µs cycle instead of once, and might require increased heatsinking.

Figure 11:
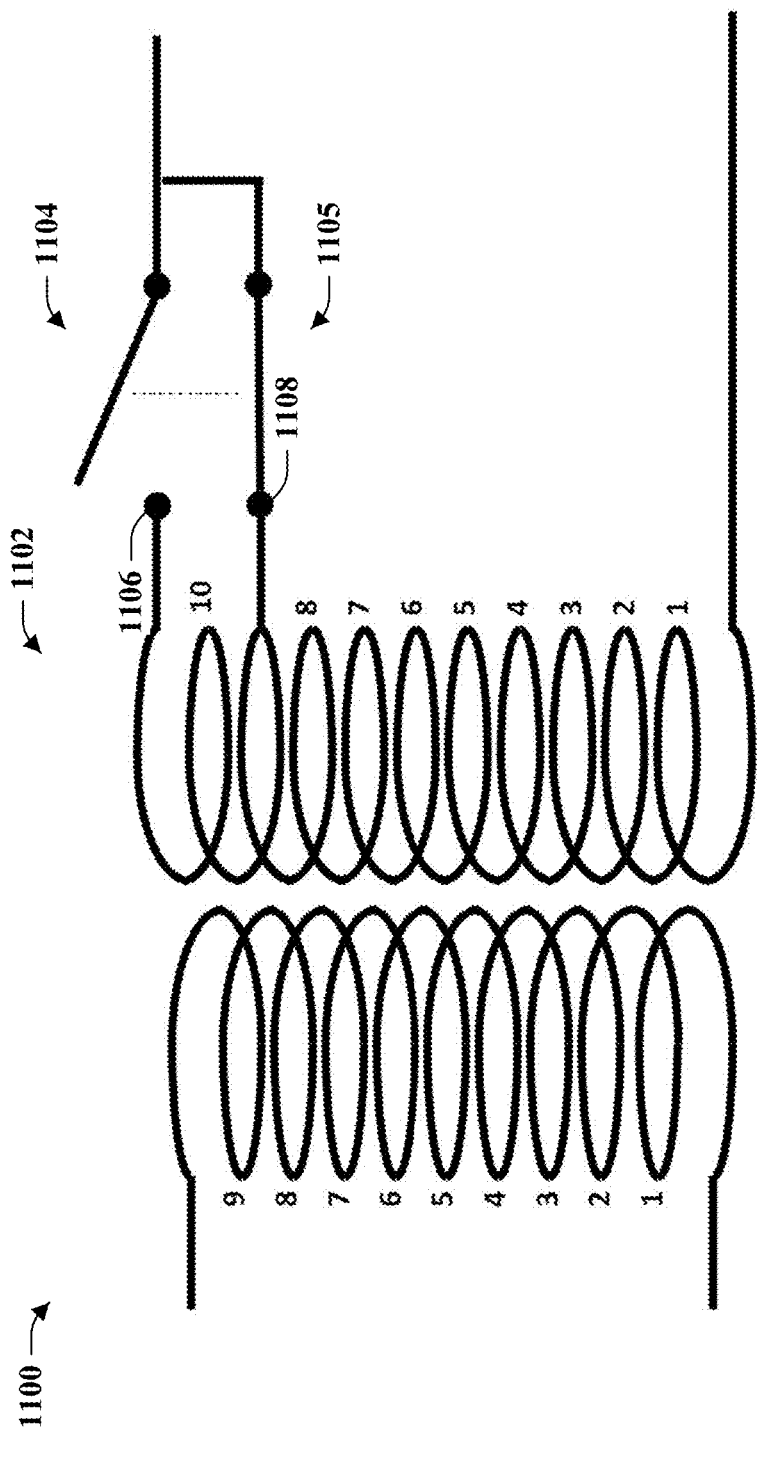
FIG. 11 is a diagram illustrating a tap switching configuration for dynamic adjustment of an effective turns ratio of windings of an SST.

It should also be noted that such a tap changer as described with respect to FIG. 11 is only needed if a transformer having bidirectional power flow is required. If it is known a priori that the net flow of power is always from left-to-right (i.e., primary to secondary), the tap changing switch could be omitted or kept in its non-conducting state to create a fixed 1.1:1 step-up transformer. The SST 100 could then be operated at a duty cycle of 1≥D≥1/1.1 as required to counteract changes in load conditions and parasitic voltage drops associated with winding resistance, leakage inductance, etc.

Simulation Results

Figure 12:
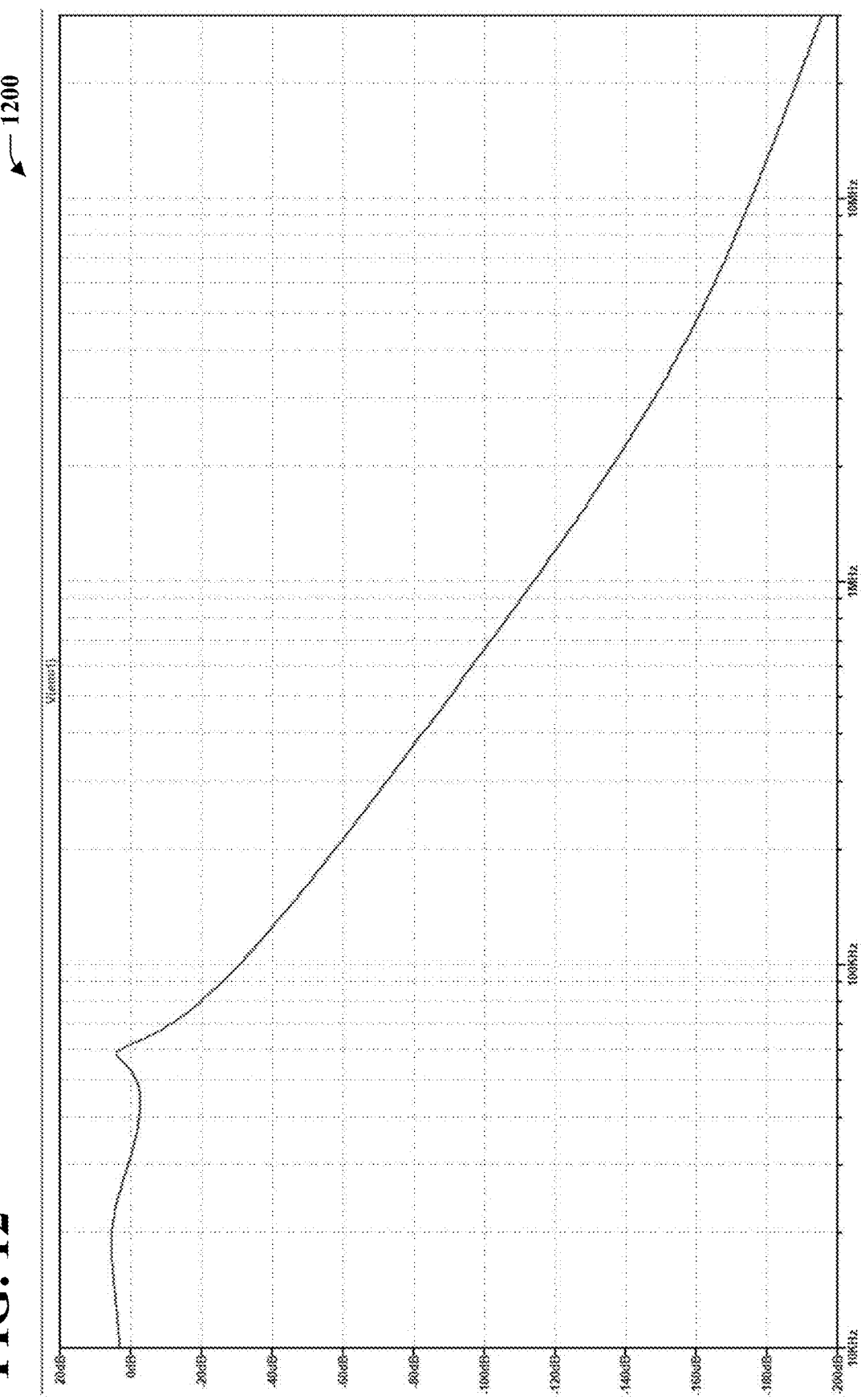
FIG. 12 is a plot of a transfer function of an exemplary EMI filter.

Exemplary simulation results relating to various aspects of the technologies set forth herein are now described. Referring now to FIG. 12, a plot 1200 of a transfer function of an EMI filter circuit (e.g., one of the filter circuits 506-516) is shown. To calculate the 10 kHz to 30 MHz filter transfer function shown in FIG. 12, an excitation source is placed at a location where the EMI stimulus originates, and then the amount of signal that feeds through the EMI filter back to the 50/60 Hz mains (normalized to 0 dB) is plotted. This requires some assumptions to be made about the impedance properties of the 50/60 Hz mains. The impedance of a real-world mains connection is strongly frequency dependent (e.g., because of wiring inductance), and somewhat variable from location to location. Thus, a device called a "Line Impedance Stabilization Network" (LISN) is used to model the AC electrical mains. The LISN is a standardized frequency dependent impedance model devised by the governing bodies for regulations pertaining to the maximum allowable EMI coupled to the AC mains as a function of frequency. These governing bodies then set frequency-dependent limits on allowable conducted emissions based on empirical data pertaining to the sensitivity of various mains-connected electrical equipment to conducted electromagnetic interference present on the 50/60 Hz power lines.

The LISN parameters used to calculate the EMI filter transfer function indicated in FIG. 12 correspond to a model PMM L3-32 purchased from Narda Safety Test Solutions. In compliance with applicable regulations, it models the impedance of each AC phase as a series connected 50 pH inductor and 5Ω resistor. In other words, each phase of the AC mains is modeled as an ideal voltage source having zero output impedance connected to the electrical receptacle in question through a 50 µH+5Ω series network. The EMI filter circuit represented by the plot 1200 is constructed according to the schematic of filter circuit 506 shown in FIG. 5, wherein C1, C2, C3, and C4 have a same capacitance of 5.6 µF, resistor R1 has a resistance of 1.3Ω, and L1 and L2 have inductance of 3.3 µH with an accompanying series resistance (not separately shown) of 0.4 mΩ. The "mains side" of the EMI filter (i.e., contrasted with a transformer side) is connected to the outputs of the LISN during measurements of voltage at the mains-side terminals of the EMI filter, such that the LISN models impedance of the AC mains as seen by the EMI filter. Results of simulations of the behavior of the EMI filter in this configuration are indicated in FIG. 12. As can be seen in FIG. 12, the EMI filter has a 3 dB cutoff frequency of ~65 kHz, ~60 dB of rejection at the 200 kHz fundamental EMI frequency for an SST of 100 kHz switching frequency, and 80 dB/decade roll off A device such as solid-state transformer can generate copious amounts of conducted EMI. If a proposed SST architecture cannot pass EMI testing, it is unlikely to become a commercially-viable product. It is therefore very important to down-select potential ideas for candidate SST architectures based on a rigorous understanding of how to avert generation of conducted EMI in the first place. Finally, it will be noted that the above discussion applies to differential mode EMI, which corresponds to voltage difference signal present between two conductors (e.g. phase 1 and neutral). There is also common mode EMI, wherein the offending high frequency signal is common to two conductors. Avoiding common mode EMI entails careful attention of parasitic coupling of the device-under-test (DUT) to its surroundings, and the use of devices called common mode inductors that present very high inductive reactance to common-mode signals, but very low impedance to differential signals.

Simulation results of transformer excitation and estimated core loss are now described. A ferrite core transformer used to generate the simulation results is comprised of a mirror-image two-part pot core fabricated from N27 MnZn ferrite that is manufactured by EPCOS/TDK (P/N B65733A0000R027). The transformer is a 1:1 transformer with identical 10-turn primary and secondary windings, each comprising 44 AWG copper Litz wire. It will be understood that a wide range of non-1:1 turns ratios may be constructed in an analogous manner, in some cases leading to the use of semi-conductor switches of different voltage and/or current ratings being used on the two sides of the SST. The number of turns used in this simulated embodiment is determined by the transformer core material and the core size, as well as the amplitude and frequency of the excitation waveform applied (in this case 480 VAC, 100 kHz). The integral of the excitation voltage with respect to time determines the magnetic flux density B(t) in the transformer core. Of particular interest is the peak amplitude of magnetic flux density (commonly designated "B") because this is what determines (1) the potential for core saturation and (2) the amount of core loss resulting from effects such as magnetic hysteresis. Constructed according to the above specifications, both the primary and secondary windings will have a magnetizing inductance of 16 mH, a series resistance of 1.35 mΩ, and will generate a peak magnetic flux density of B=65 mT.

Figure 13A:
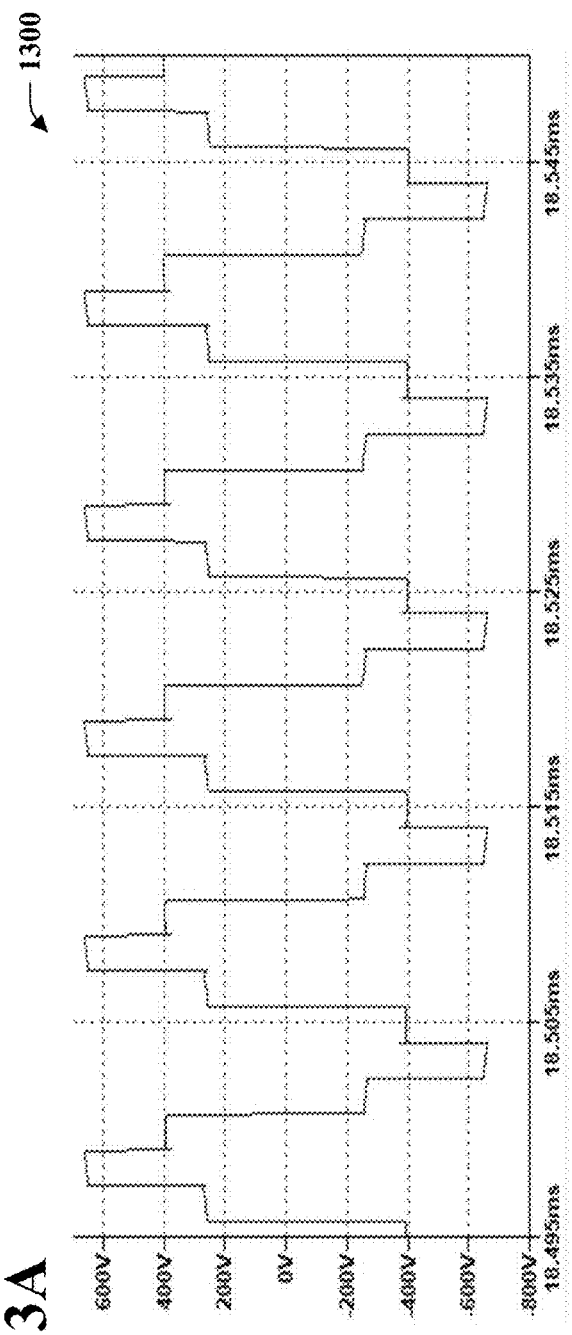
FIG. 13A illustrates a plot of a voltage waveform applied to a primary winding of an SST.
Figure 13B:
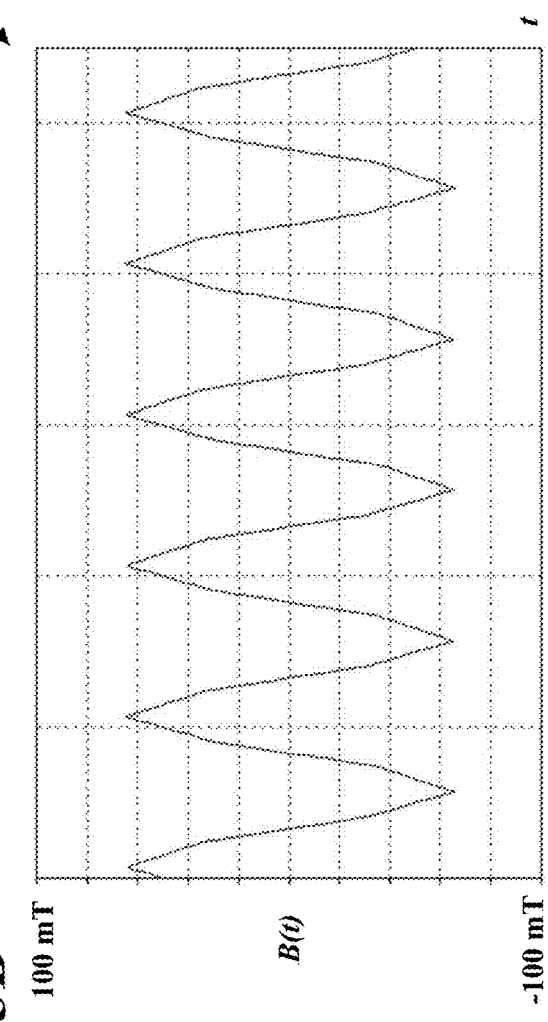
FIG. 13B illustrates a plot of a simulated magnetic flux density in a transformer core in response to the waveform of FIG. 13A being applied to the primary winding of the SST.

The core loss coefficient for the N27 material at a frequency of 100 kHz and peak magnetic flux density of 65 mT is estimated from its data sheet to be $1.0 \times 10^5$ W m$^{-3}$. The core volume is $3.44 \times 10^{-4}$ m$^3$, so estimated core losses of 34 W are expected. It should be noted that there are many ferrite compositions other than N27 that are potentially well suited to this application. Referring now to FIG. 13A, a plot 1300 of a 100 kHz, 480 VAC rms, piece-wise voltage waveform applied to the primary winding is shown. FIG. 13B shows a roughly sinusoidal B(t) waveform 1302 generated in the transformer core in response to the voltage waveform depicted in the plot 1300 being applied.

The SPICE model used to generate the plot 1302 uses an assumption of K=0.9995, where K is the coupling constant for mutual inductance between the primary and secondary winding of the transformer. It will be understood that the coupling constant of a transformer is very much dependent on its construction, and in some applications the condition K«1 may be desirable. Planar magnetic transformers provide perhaps the most convenient means to achieve very low leakage inductance, but for the purposes of quantitative circuit simulations, K=0.9995 is realistic for a transformer intentionally designed to have very low leakage inductance.

Figure 14:
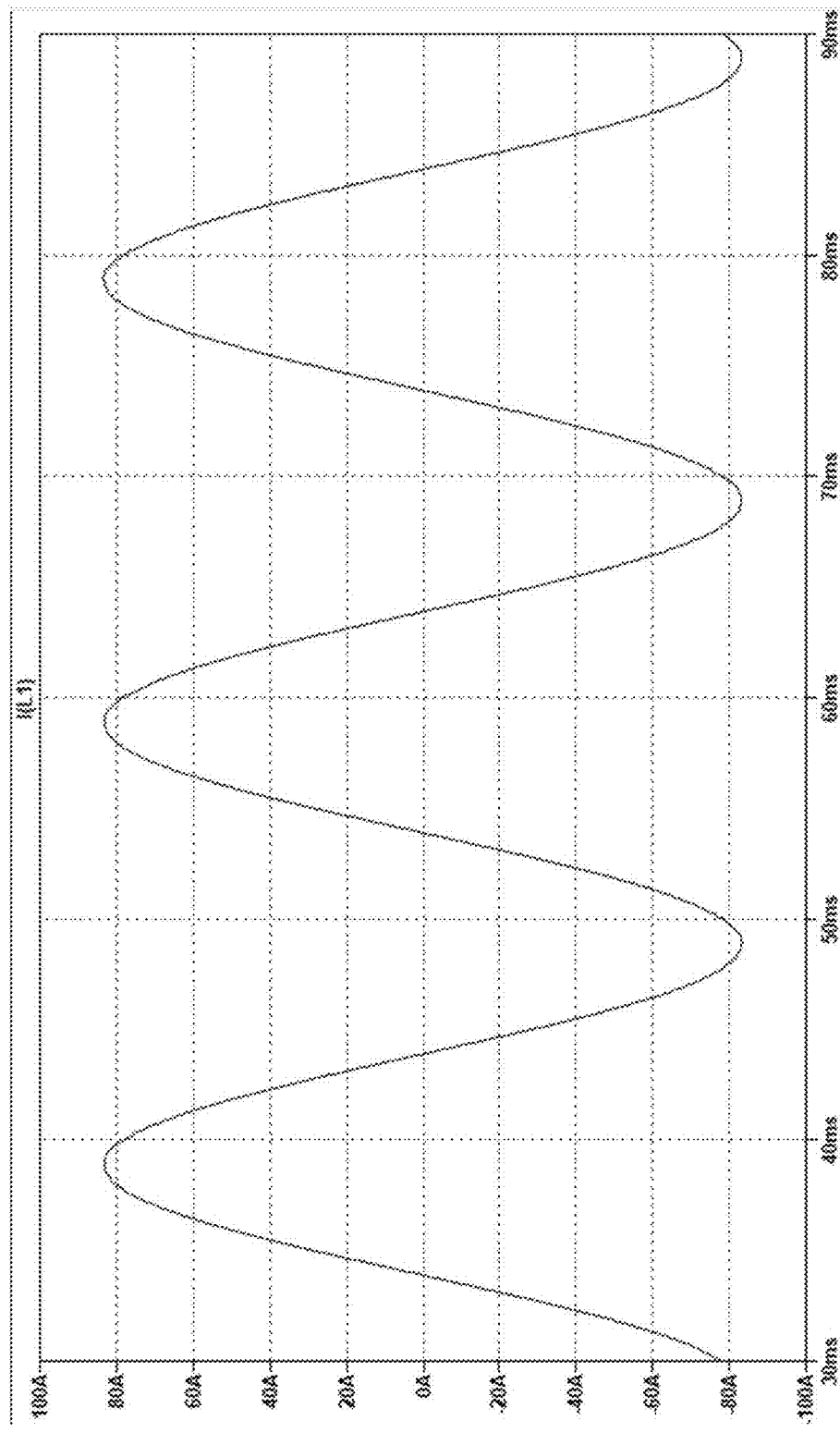
FIG. 14 is a plot of a simulated current flow through an inductor of an exemplary EMI filter.
Figure 15:
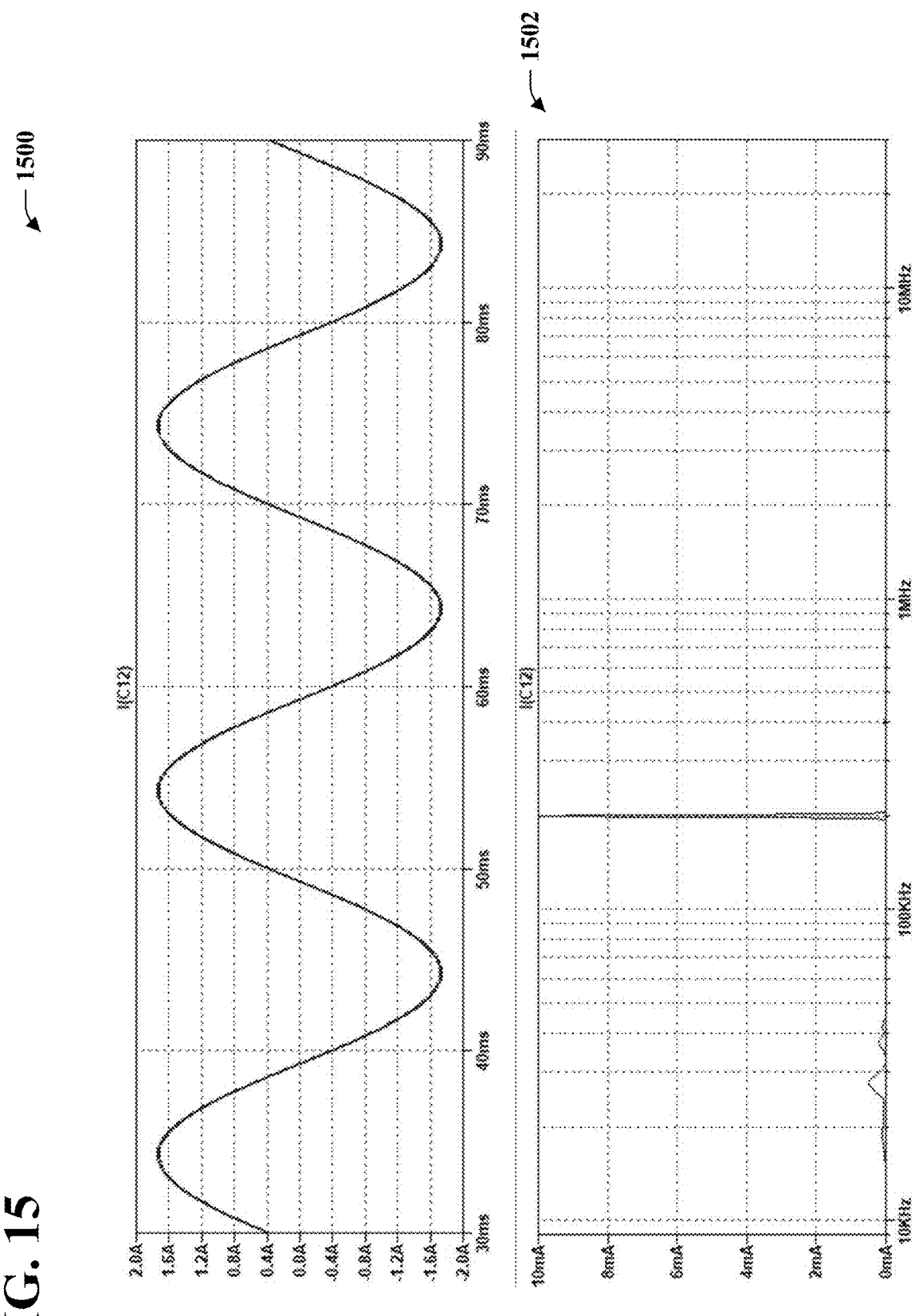
FIG. 15 illustrates a plot of a simulated current flow through a capacitor of an exemplary EMI filter and its corresponding spectrum.

Further simulation results depict the stresses applied to the passive components used in the EMI filters 502, 504 for an exemplary embodiment of the LMI3-SST 100 running at a power of 45 kW, as well as the MOSFETs used in each of the 4-quadrant switches 4QS1-4QS12. In each of the SPICE simulations described here, a line voltage frequency of 50 Hz is assumed. FIG. 14 illustrates a plot 1400 of current through inductors of the EMI filters 502, 504. Using a Wurth inductor P/N 7443763521033, rated for 3.3 µH, 0.40 mΩ, $I_{rms}$=75 A, $I_{sat}$=91 A, the plot 1400 indicates that inductor current is well within operating limits both from the standpoint of time-averaged power dissipation and avoidance of magnetic saturation. FIG. 15 shows a plot 1500 of the current waveform through the outmost EMI filter capacitor (e.g., capacitor C2 in FIG. 5). In an exemplary embodiment, this capacitor can be TDK capacitor with P/N B32926D3156M, rated for 15 µF, 8 mΩ, 305 VAC. It is the least stressed of the three capacitors used in each of the EMI filters 506-516, with a current waveform that almost entirely consists of a 1.2 A rms, 50 Hz sine wave. The frequency spectrum 1502 of the current waveform indicates that the outermost capacitor passes 10 mA rms of current at 200 kHz, with negligible current at higher harmonics. This capacitor is therefore functioning well within its designed operating envelope.

Figure 16:
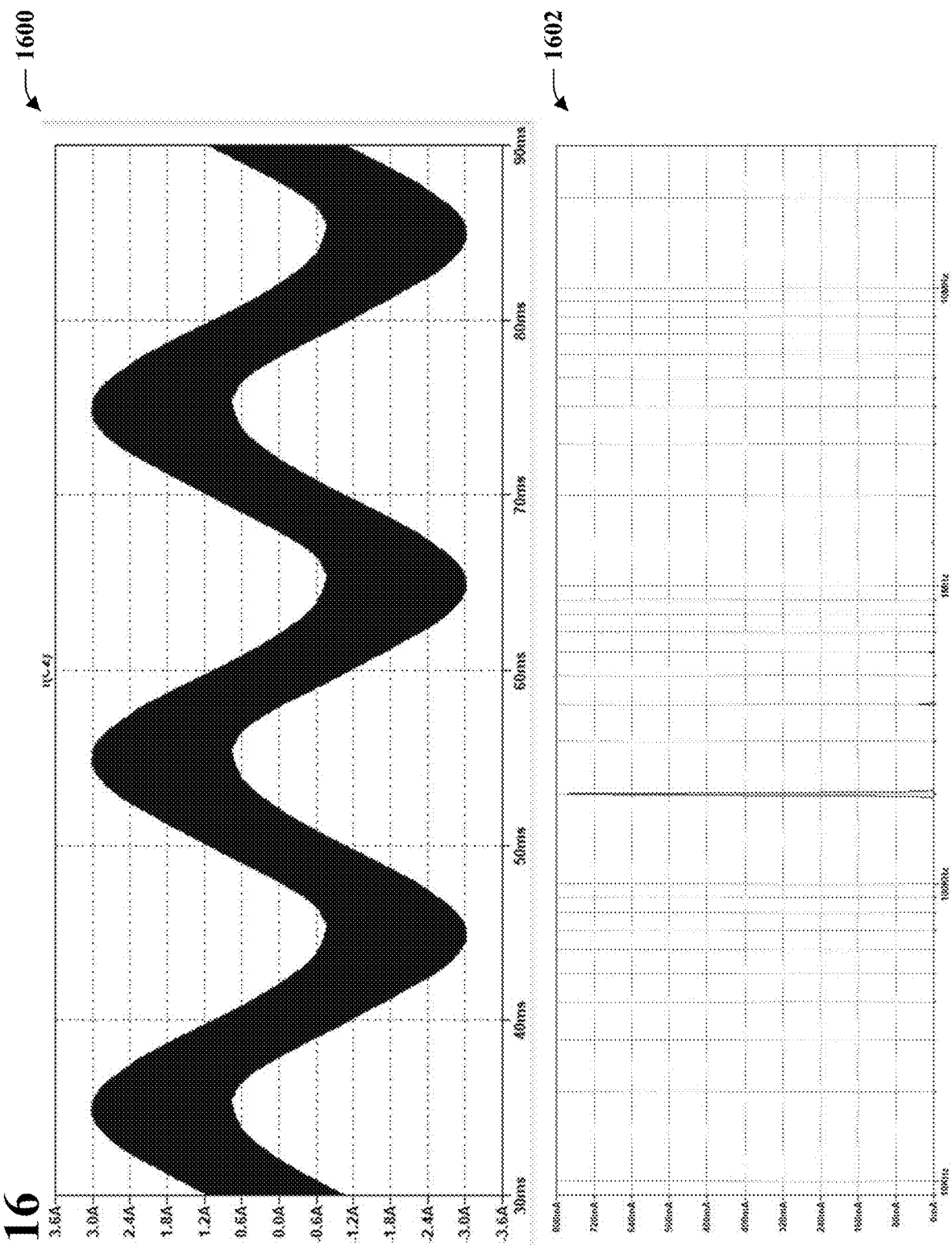
FIG. 16 illustrates a plot of a simulated current flow through another capacitor of the exemplary EMI filter and its corresponding spectrum.

FIG. 16 illustrates a plot 1600 of current through the middle EMI filter capacitor (e.g., C3 in FIG. 5) where again the current is approximately 1.2 A rms at 50 Hz. However, superimposed on this 50 Hz wave there is 780 mA rms at 200 kHz, as indicated by the spike in the spectral plot 1602. This capacitor is therefore functioning well within its designed operating envelope as well.

Figure 17:
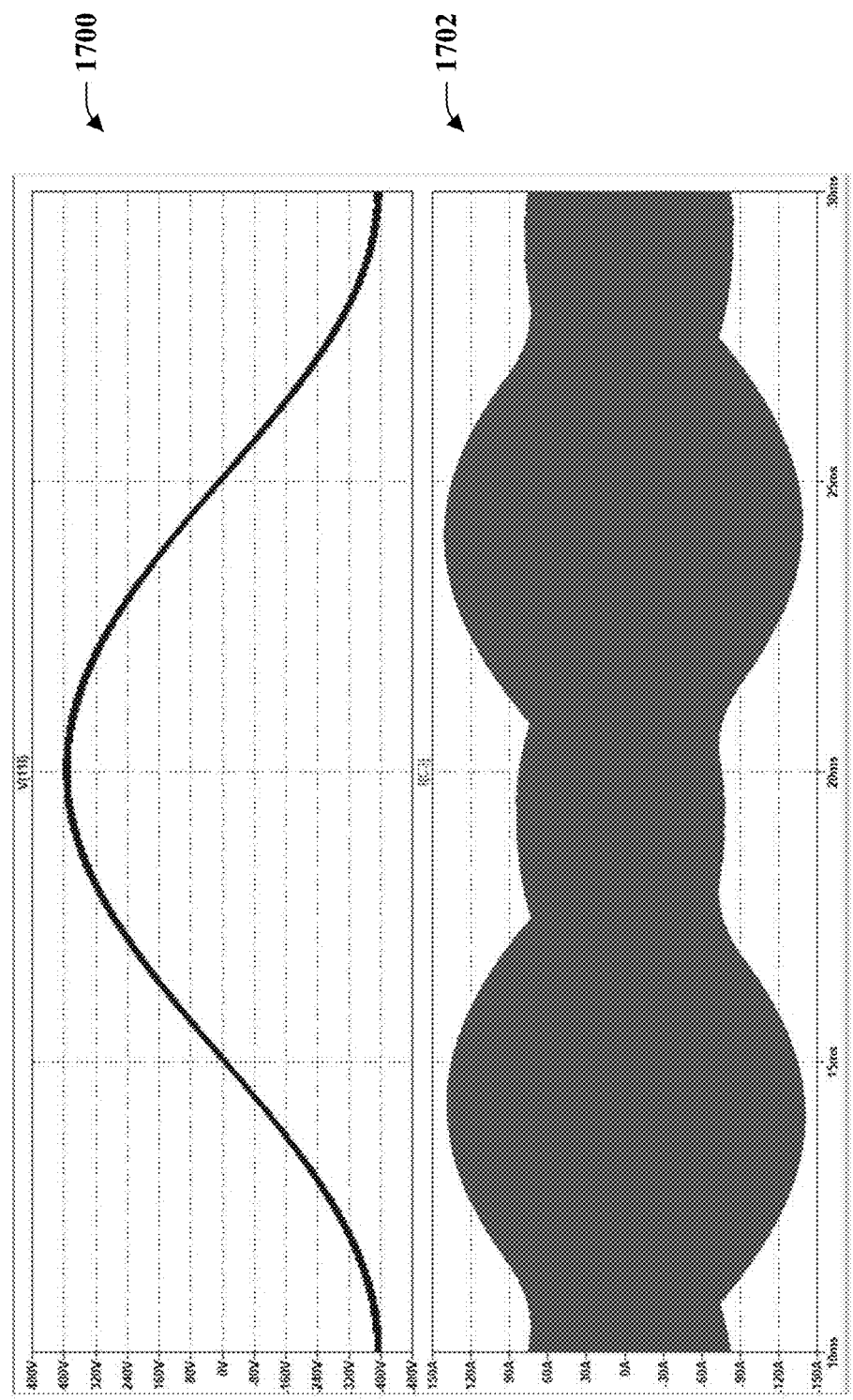
FIG. 17 illustrates plots of simulated voltage across and current through still another capacitor in the exemplary EMI filter.
Figure 18:
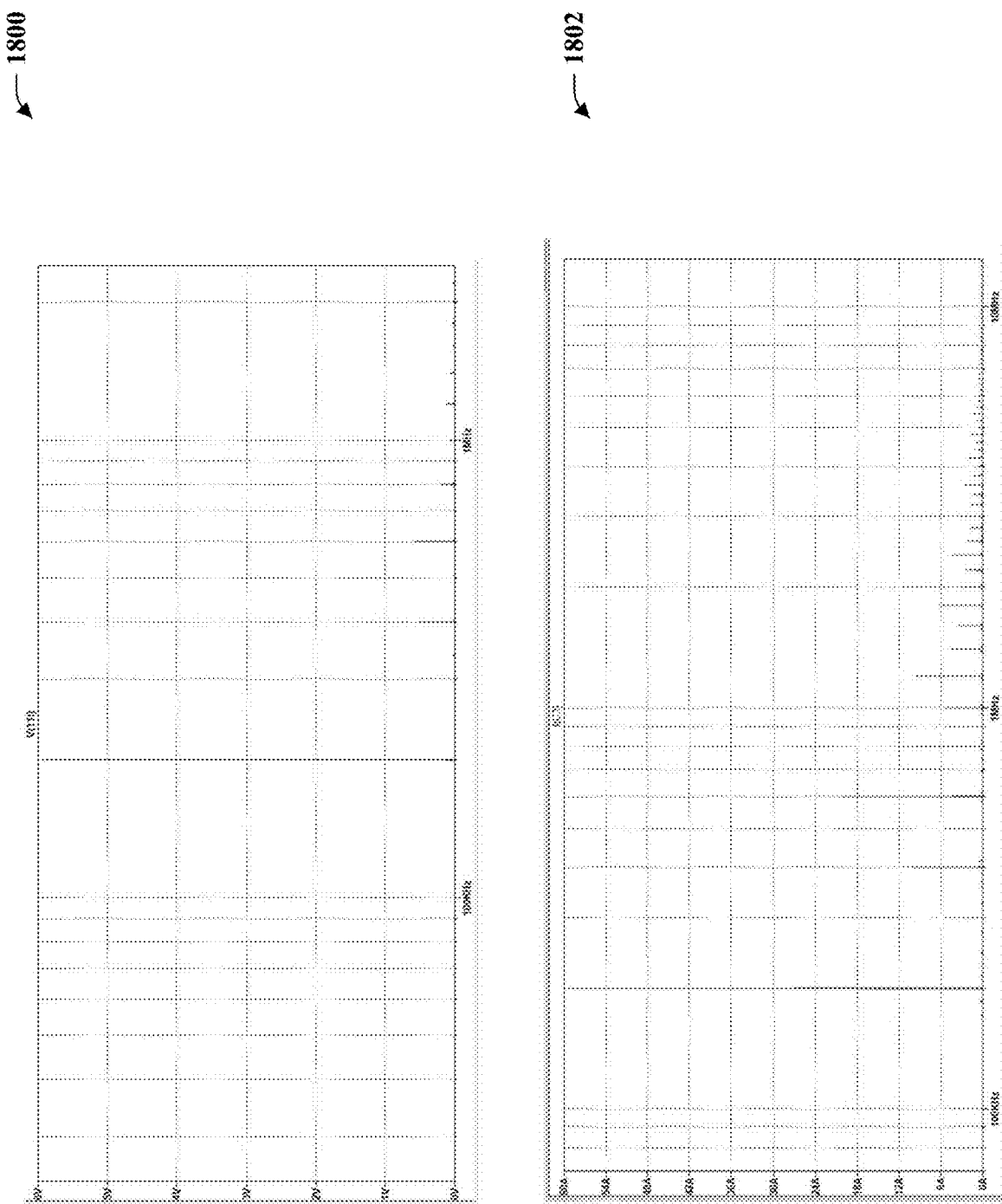
FIG. 18 illustrates spectral plots of the simulated voltage and current waveforms depicted in FIG. 17.

The inner most EMI filter capacitor (e.g., the capacitor C4 in FIG. 5) sees by far the highest stress. Substantially all of the 200 kHz EMI current (and its harmonics) generated during operation of the SST 100 passes through this capacitor. FIG. 17 shows a plot 1700 of the voltage waveform V(t) across this capacitor and a plot 1702 of the current waveform I(t) through the capacitor. As expected, the voltage waveform looks for the most part like a 50 Hz, 277 VAC rms sine wave (277=480/√3). Referring now to FIG. 18, a corresponding spectral plot 1800 of the voltage across the capacitor indicates that there is also a 6.5 VAC rms signal at 200 kHz plus harmonics. This accounts for the 65 A rms, 200 kHz current waveform through the inner most EMI capacitor observed in a spectral plot 1802 of the capacitor current. To handle this quantity of ripple current and magnitude of dV/dt, a special grade of polypropylene capacitor can be used (e.g., as supplied by Cornell Dublier P/N 105PPS700K, rated for 1.0 µF, 4.1 µW) in an 8-capacitor array. As noted previously, a large number of bypass capacitors in parallel is not uncommon in high-power, high-frequency, voltage-source converters, but in the case of special grade film capacitors, their impact on overall system cost is non-negligible. Further embodiments described below circumvent this problem. Finally, it should also be noted that smaller value, surface mount, NPO-dielectric capacitors can be placed in immediate proximity to the phase input and output nodes of the SST 100 to provide a low equivalent series resistance (ESR), ultralow-inductance path for the highest frequency components of the I(t) current draw waveform.

It will further be understood that different and lower capacitance values can be used for the capacitors in an EMI filter described herein when the fundamental frequency is higher. By way of example, and as described above with respect to FIG. 10, a plurality of SSTs described herein (e.g., the SST 100) can be connected in parallel, wherein the switching waveforms of the switches of the SSTs are staggered in phase. In the three-SST exemplary system shown in FIG. 10, a fundamental frequency of the EMI waveform at common input and output terminals of the SSTs is raised from 200 kHz for a single SST to 600 kHz for the three-SST system. It is to be understood that substantially any number of SSTs can be so-connected, and that corresponding EMI can have a fundamental frequency that is at any of various frequencies higher than 600 kHz. A higher EMI fundamental frequency allows capacitors and inductors that have smaller capacitance and inductance values to be used in the EMI filter to achieve a similar reduction in EMI amplitude passed to the mains or a load. The lower capacitance values of the capacitors can alleviate ringing of the EMI filter, potentially eliminating the need for current inrush limiting circuitry. The lower capacitance values of the capacitors can also make it practical to use lower-cost, low-loss ceramic capacitors for the most highly stressed portion of the EMI filter (e.g., the capacitor C4 in FIG. 5).

Lastly, with regard to MOSFET stresses, each 4-quadrant switch consists of two MOSFETs. In exemplary embodiments, the MOSFETS have an on-state resistance of approximately 15 me. At any given time, power must be transmitted through 4 MOSFETs in series on the primary side of the transformer 100 and 4 MOSFETs in series on the secondary side of the transformer 100 ($R_{total}$=8×15 mΩ=120 mΩ). At full load of an exemplary 45 kW SST, the rms current through the primary and/or secondary is 102 A rms, the total power dissipation in the MOSFET switches is 1200 W, each MOSFET sees an rms current of 34 A, and each MOSFET is subject to a power dissipation of 50 W. The MSC015SMA070B SiC MOSFET has a maximum current rating of 131 A, and with extremely good heat sinking, its TO-247 package can dissipate as much as 400 W of waste heat on a continuous basis according to the manufacturer's data sheet. Accordingly, existing MOSFETs are capable of handling the current and power dissipation needs of MOSFETs of the SST 100.

Figure 19:
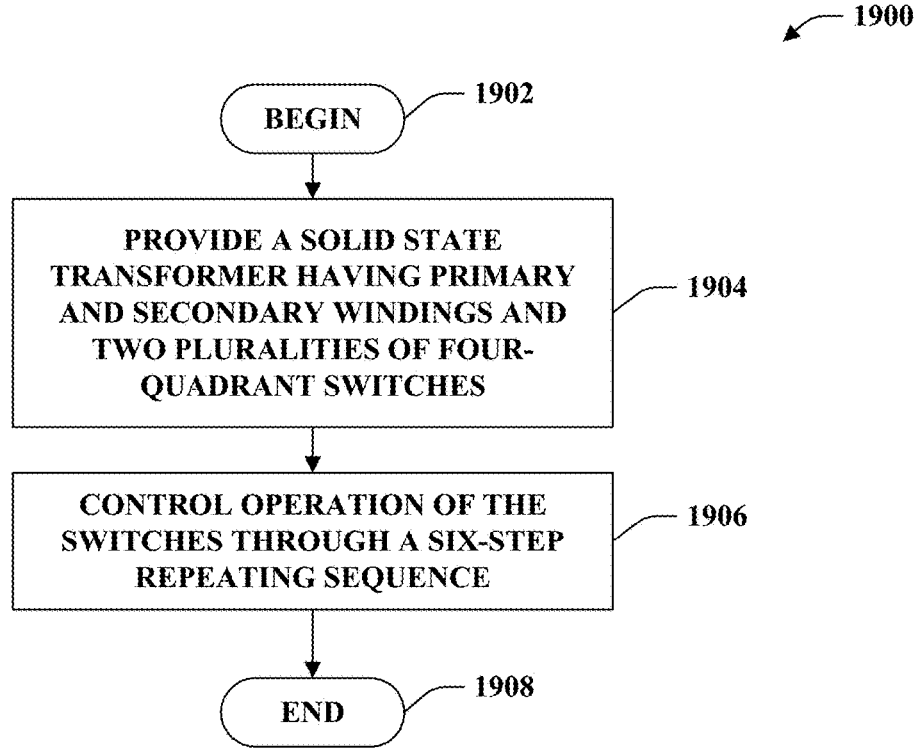
FIG. 19 is a flow diagram that illustrates an exemplary methodology for making and operating an SST.

FIG. 19 illustrates an exemplary methodology relating to fabrication and operation of an SST. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

Referring now to FIG. 19, a methodology 1900 that facilitates operation of an SST at high frequency is illustrated. The methodology 1900 begins at 1902, and at 1904, an SST is provided that has a primary winding, a secondary winding, a first plurality of switches, and a second plurality of switches. By way of example, an SST constructed in similar fashion to the SST 100 can be provided. It is to be understood that the SST provided at 1904 can include various additional elements, such as EMI filters (e.g., EMI filters 502, 504), star point inductors, or the like. At 1906, operation of the switches is controlled through a six-step repeating sequence, by way of which three input phases are successively coupled to the primary winding and three output phases are correspondingly successively coupled to the secondary winding. By way of example, the switches can be controlled in the six-step sequence described above with respect to FIGS. 3 and 4. The switches are controlled such that, for each of the six steps of the sequence, two of the input and output phases are coupled to each of the primary and secondary windings at a time, and the amplitude modulation index of the transformer excitation waveform is constrained to be small (e.g. 7%). Accordingly, a frequency of a voltage waveform applied across the primary and secondary windings can be substantially higher than a 50/60 Hz mains input to the SST. In turn this can allow for various improvements to size, weight, and material costs of the SST as compared to a conventional steel core copper winding transformer.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A three-phase solid-state transformer (SST), comprising:
   a primary winding;
   a secondary winding;
   a first bank of four-quadrant switches that are connected to the primary winding;
   a second bank of four-quadrant switches that are connected to the secondary winding; and
   a switch driver circuit configured to control operation of the first bank of switches and the second bank of switches such that the first bank of switches and the second bank of switches are toggled through a plurality of configurations in sequence, wherein for each of the configurations, the primary winding is connected to two of three input lines by way of the first bank of switches and the secondary winding is connected to two of three output lines by way of the second bank of switches.

2. The three-phase SST of claim 1, wherein the first bank of switches consists of six switches and the second bank of switches consists of six switches.

3. The three-phase SST of claim 1, wherein each of the switches comprises, respectively:
   a first MOSFET; and
   a second MOSFET, wherein a terminal of the second MOSFET is connected to a terminal of the first MOSFET.

4. The three-phase SST of claim 3 wherein the first MOSFET and the second MOSFET are connected in a common drain configuration.

5. The three-phase SST of claim 3 wherein the first MOSFET and the second MOSFET are connected in a common source configuration.

6. The three-phase SST of claim 3 wherein the first MOSFET and the second MOSFET are silicon carbide MOSFETs.

7. The three-phase SST of claim 1, wherein for each of the plurality of configurations, two switches in the first bank of switches are closed, and two switches in the second bank of switches are closed.

8. The three-phase SST of claim 1, further comprising:
   a first filter that is coupled to the first bank of switches; and
   a second filter that is coupled to the second bank of switches, wherein each of the first filter and the second filter has a cutoff frequency that is less than a switching frequency of the first bank of switches and the second bank of switches.

9. The three-phase SST of claim 1, wherein the plurality of configurations comprises six different configurations.

10. The three-phase SST of claim 1, wherein the switch driver circuit toggles each of the switches at a frequency of greater than or equal to 100 kHz.

11. A transformer that comprises:
    a core;
    a primary winding wound about the core;
    a secondary winding wound about the core;
    a first plurality of switches, wherein each of the first switches is a four-quadrant switch, the first switches connected to the primary winding;
    a second plurality of switches, wherein each of the second switches is a four-quadrant switch, the second switches connected to the secondary winding; and
    a control circuit that is coupled to the first switches and the second switches and is configured to operate the switches such that the switches are toggled through a plurality of six configurations in a repeating sequence, wherein for each configuration of the switches two of three input lines are coupled to the primary winding and two of three output lines are coupled to the secondary winding.

12. The transformer of claim 11, further comprising a primary-side filter circuit, wherein the primary-side filter circuit comprises:
    a first filter circuit that receives as input a first line voltage having a first phase, wherein an output of the first filter circuit is connected to a first input terminal of the first plurality of switches;
    a second filter circuit that receives as input a second line voltage having a second phase, wherein an output of the second filter circuit is connected to a second input terminal of the first plurality of switches; and
    a third filter circuit that receives as input a third line voltage having a third phase, wherein an output of the third filter circuit is connected to a third input terminal of the first bank of switches.

13. The transformer of claim 12, wherein the first filter circuit comprises a first three-stage L-C filter, and wherein the second filter circuit comprises a second three-stage L-C filter.

14. The transformer of claim 11, wherein the core comprises ferrite.

15. The transformer of claim 11, the first plurality of switches comprising:
    a third plurality of switches, wherein each switch in the third plurality of switches is connected to a first terminal of the primary winding and a respective input line in the three input lines; and
    a fourth plurality of switches, wherein each switch in the fourth plurality of switches is connected to a second terminal of the primary winding and a respective input line in the three input lines.

16. The transformer of claim 15, wherein for each of the six configurations a switch in the third plurality of switches is closed and a switch in the fourth plurality of switches is closed.

17. The transformer of claim 11, wherein a modulation index of a magnetic flux density in the core is less than or equal to 25%.

18. The transformer of claim 11, further comprising a first switch not included in the first plurality of switches or the second plurality of switches, wherein the first switch is configured such that toggling the first switch changes a turns ratio between the primary winding and the secondary winding.

19. The transformer of claim 11, wherein the secondary winding comprises a first terminal and a second terminal, the transformer further comprising:
    a first inductor that has a first terminal and a second terminal, wherein the first terminal of the first inductor is connected to the first terminal of the secondary winding; and a second inductor that has a first terminal and a second terminal, wherein the first terminal of the second inductor is connected to the second terminal of the secondary winding, and wherein the second terminal of the second inductor is connected to the second terminal of the first inductor, wherein the second terminals of the first inductor and the second inductor define a neutral wire of a four-wire output of the transformer.

20. A method comprising:
providing a transformer that comprises:
- a primary winding;
- a secondary winding;
- a first plurality of switches; and
- a second plurality of switches; and controlling the first plurality of switches and the second plurality of switches such that the switches are opened and closed in a six-step repeating sequence, wherein during each step of the sequence, two of the first plurality of switches are closed, two of the second plurality of switches are closed, two of three input lines are connected to the primary winding, and two of three output lines are connected to the secondary winding.

* * * * *